(12) United States Patent
Basrur et al.

(10) Patent No.: US 12,543,374 B2
(45) Date of Patent: Feb. 3, 2026

(54) DISPLAY DEVICE AND METHOD OF FABRICATING THE SAME

(71) Applicant: Samsung Display Co., LTD., Yongin-si (KR)

(72) Inventors: Veidhes Basrur, Yongin-si (KR); Ki Nyeng Kang, Yongin-si (KR); In Pyo Kim, Yongin-si (KR); Ock Soo Son, Yongin-si (KR); Jong Hwan Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 418 days.

(21) Appl. No.: 18/095,662

(22) Filed: Jan. 11, 2023

(65) Prior Publication Data

US 2023/0253413 A1 Aug. 10, 2023

(30) Foreign Application Priority Data

Feb. 9, 2022 (KR) .................. 10-2022-0017078

(51) Int. Cl.
*H10D 86/60* (2025.01)
*H01L 25/16* (2023.01)
*H10D 86/01* (2025.01)
*H10D 86/40* (2025.01)

(52) U.S. Cl.
CPC ........... *H10D 86/60* (2025.01); *H01L 25/167* (2013.01); *H10D 86/0251* (2025.01); *H10D 86/441* (2025.01); *H10D 86/451* (2025.01)

(58) Field of Classification Search
None
See application file for complete search history.

(56) References Cited

U.S. PATENT DOCUMENTS

| | | |
|---|---|---|
| 6,518,642 B2 | 2/2003 | Kim et al. |
| 6,693,315 B2 | 2/2004 | Kuroda et al. |
| 9,997,464 B2 | 6/2018 | Hsieh et al. |
| 11,594,171 B2 | 2/2023 | Kang et al. |
| 11,778,885 B2 | 10/2023 | Kim et al. |
| 2018/0308912 A1 | 10/2018 | Kim et al. |
| 2021/0132722 A1 | 5/2021 | Kim et al. |
| 2021/0175304 A1 | 6/2021 | Lee et al. |
| 2021/0183826 A1 | 6/2021 | Chang et al. |
| 2021/0288104 A1 | 9/2021 | Yang et al. |

FOREIGN PATENT DOCUMENTS

| | | |
|---|---|---|
| EP | 3 855 495 | 7/2021 |
| KR | 10-2020-0032809 A | 3/2020 |
| KR | 10-2021-0086791 A | 7/2021 |

*Primary Examiner* — Bo B Jang
(74) *Attorney, Agent, or Firm* — Womble Bond Dickinson (US) LLP

(57) ABSTRACT

Provided herein is a display device and a method of fabricating the display device. The display device includes a substrate including a display area and a non-display area, a via layer disposed in the display area, electrodes disposed on the via layer and spaced apart from each other, light emitting elements disposed between the electrodes, dummy pattern layers disposed in the non-display area, and dummy electrodes disposed on the dummy pattern layers. The via layer and the dummy pattern layers may be disposed on a same layer. The electrodes and the dummy electrodes may be disposed on a same layer.

19 Claims, 25 Drawing Sheets

FIG. 14
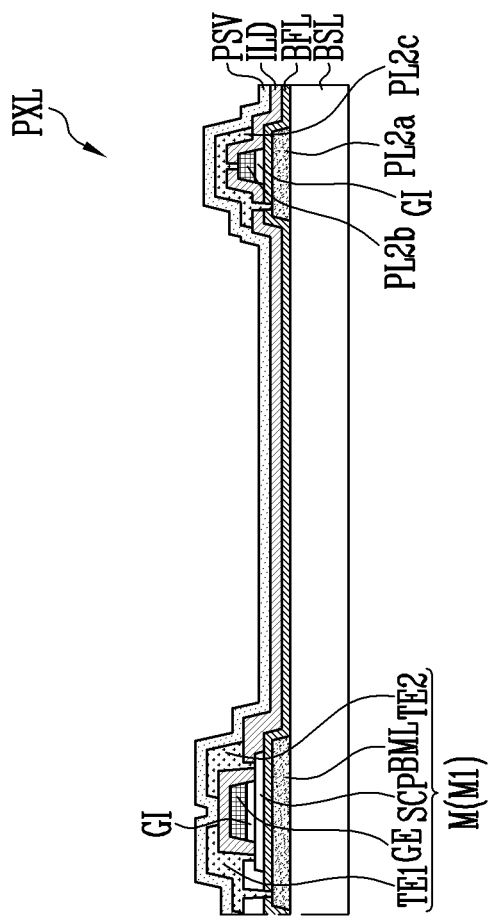
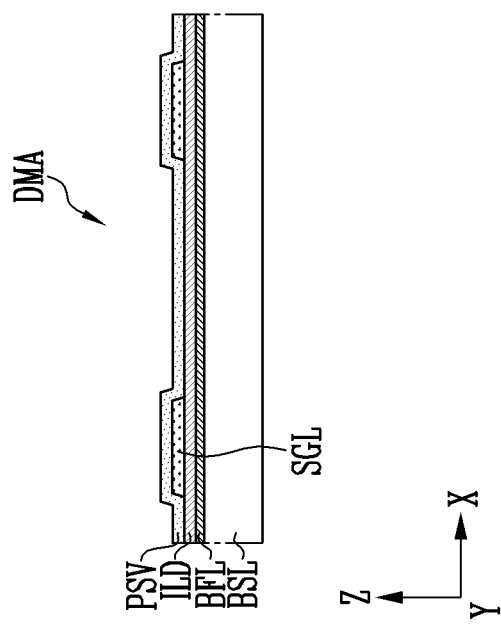

DISPLAY DEVICE AND METHOD OF FABRICATING THE SAME

CROSS-REFERENCE TO RELATED APPLICATION(S)

The application claims priority to and benefits of Korean patent application number 10-2022-0017078 under 35 U.S.C. § 119, filed on Feb. 9, 2022, the entire contents of which are incorporated herein by reference.

BACKGROUND

1. Technical Field

Embodiments relate to a display device and a method of fabricating the display device.

2. Description of the Related Art

Recently, as interest in information display increases, research and development on display devices have been continuously conducted.

SUMMARY

Embodiments of the disclosure are directed to a display device capable of enhancing uniformity of contact holes and electrodes in a display area, and a method of fabricating the display device.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display device may include: a substrate including a display area and a non-display area; a via layer disposed in the display area; electrodes disposed on the via layer and spaced apart from each other; light emitting elements disposed between the electrodes; dummy pattern layers disposed in the non-display area; and dummy electrodes disposed on the dummy pattern layers. The via layer and the dummy pattern layers may be disposed on a same layer. The electrodes and the dummy electrodes may be disposed on a same layer.

In an embodiment, the dummy pattern layers may include dummy holes.

In an embodiment, the display device may further include signal lines disposed between the substrate and the dummy pattern layers.

In an embodiment, the dummy holes may include a first dummy hole formed to expose the signal lines, and a second dummy hole adjacent to the first dummy hole.

In an embodiment, the dummy electrodes may cover the signal lines exposed through the first dummy hole.

In an embodiment, the dummy electrodes may not overlap the second dummy hole.

In an embodiment, the display device may further include an insulating layer disposed on the light emitting elements and the dummy electrodes.

In an embodiment, the display device may further include a color conversion layer disposed on the light emitting elements.

In an embodiment, the color conversion layer may overlap the dummy pattern layers.

In an embodiment, the display device may further include a color filter layer disposed on the color conversion layer.

In an embodiment, a display device may include: a substrate including a display area and a non-display area; a via layer disposed in the display area; electrodes disposed on the via layer and spaced apart from each other; light emitting elements disposed between the electrodes; dummy pattern layers disposed in the non-display area; and dummy electrodes disposed on the dummy pattern layers, wherein the via layer and the dummy pattern layers may be formed of a first same material, and the electrodes and the dummy electrodes may be formed of a second same material.

In an embodiment, a method of fabricating a display device, the method may include: forming a coating layer on a substrate; forming a via layer in a display area and dummy pattern layers in a non-display area by etching the coating layer; forming an electrode layer on the via layer and the dummy pattern layers; and forming electrodes on the via layer and dummy electrodes on the dummy pattern layers by etching the electrode layer.

In an embodiment, the method may further include forming a source electrode and/or a drain electrode between the substrate and the via layer.

In an embodiment, the method may further include forming signal lines between the substrate and the dummy pattern layers.

In an embodiment, the source electrode, the drain electrode, and the signal lines may be simultaneously formed.

In an embodiment, during a process of etching the coating layer, a contact hole that exposes the source electrode and/or the drain electrode may be formed in the via layer.

In an embodiment, a first dummy hole that exposes the signal lines, and a second dummy hole other than the first dummy hole may be formed in the dummy pattern layers by etching the coating layer.

In an embodiment, the dummy electrodes may be formed on the first dummy hole and the second dummy hole.

In an embodiment, the method may further include removing the dummy electrodes from the second dummy hole.

In an embodiment, the method may further include disposing light emitting elements between the electrodes.

In an embodiment, the method may further include forming an insulating layer on the light emitting elements and the dummy electrodes.

Details of various embodiments are included in the detailed descriptions and drawings.

BRIEF DESCRIPTION OF THE DRAWINGS

FIGS. 13 to 24 are schematic cross-sectional views illustrating, by process steps, a method of fabricating the display device in accordance with an embodiment.

DETAILED DESCRIPTION OF THE EMBODIMENTS

Figure 1:
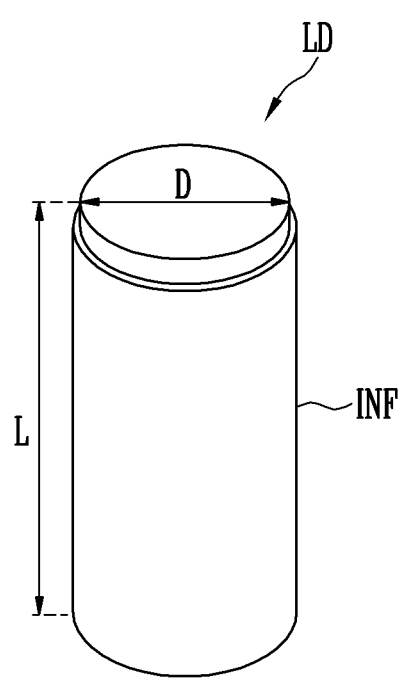
FIG. 1 is a schematic perspective view illustrating a light emitting element in accordance with an embodiment.

Advantages and features of the disclosure, and methods for achieving the same will be cleared with reference to embodiments described below in detail together with the accompanying drawings. The disclosure is not limited to the following embodiments, and various modifications are possible. These embodiments are provided so that this disclosure will be thorough and complete and will fully convey the concept of the disclosure to those skilled in the art, and the disclosure will only be defined by the appended claims.

The terminology used herein is for the purpose of describing particular embodiments only and is not intended to be limiting of embodiments. In this specification, the terms of a singular form may include plural forms unless specifically mentioned. It will be further understood that the terms "comprises" and/or "comprising", when used in this specification, specify the presence of stated features, steps, operations and/or components do not preclude the presence or addition of one or more features, steps, operations and/or components.

For example, the term "coupling" or "connection" may comprehensively refer to physical and/or electrical coupling or connection. In addition, the term "coupling" or "connection" may comprehensively refer to direct or indirect coupling or connection and integral or non-integral coupling or connection. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

It will be understood that when an element or a layer is referred to as being "on" another element or a layer, it can be directly on, connected to, or coupled to the other element or the layer, or one or more intervening elements or layers may be present. Like reference numerals refer to like elements throughout.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Hereinafter, embodiments of the disclosure will be described in detail with reference to the accompanying drawings.

Figure 2:
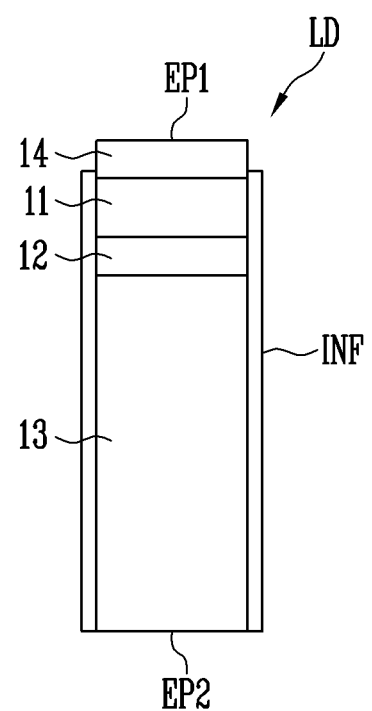
FIG. 2 is a schematic cross-sectional view illustrating a light emitting element in accordance with an embodiment.

FIG. 1 is a schematic perspective view illustrating a light emitting element in accordance with an embodiment. FIG. 2 is a schematic cross-sectional view illustrating a light emitting element in accordance with an embodiment. Although FIGS. 1 and 2 illustrate a column-type light emitting element LD, the type and/or shape of the light emitting element LD is not limited thereto.

Referring to FIGS. 1 and 2, the light emitting element LD may include a first semiconductor layer 11, an active layer 12, a second semiconductor layer 13, and/or an electrode layer 14.

The light emitting element LD may be formed in the form of a column extending in a direction (e.g., a longitudinal direction). The light emitting element LD may include a first end portion EP1 and a second end portion EP2. One of the first and second semiconductor layers 11 and 13 may be disposed on the first end portion EP1 of the light emitting element LD. Another one of the first and second semiconductor layers 11 and 13 may be disposed on the second end portion EP2 of the light emitting element LD. For example, the first semiconductor layer 11 may be disposed on the first end portion EP1 of the light emitting element LD, and the second semiconductor layer 13 may be disposed on the second end portion EP2 of the light emitting element LD.

In an embodiment, the light emitting element LD may be a light emitting element formed in a column shape by an etching process or the like. In the descriptions, the term "column-type" embraces a rod-like shape and a bar-like shape such as a cylindrical shape and a prismatic shape having an aspect ratio greater than about 1, and the cross-sectional shape thereof is not limited thereto.

The light emitting element LD may have a small size corresponding to a range of the nanometer scale to the micrometer scale. For example, the light emitting element LD may have a diameter D (or a width) and/or a length L having a range of the nanometer scale to the micrometer scale. However, the size of the light emitting element LD is not limited thereto, and the size of the light emitting element LD may be changed in various ways according to design conditions of various devices, e.g., a display device, using a light emitting device with the light emitting element LD as a light source.

The first semiconductor layer 11 may be a first conductive semiconductor layer. For example, the first semiconductor layer 11 may include a p-type semiconductor layer. For instance, the first semiconductor layer 11 may include a p-type semiconductor layer which includes any one semiconductor material of InAlGaN, GaN, AlGaN, InGaN, or AlN, and is doped with a first conductive dopant such as Mg. However, the material for forming the first semiconductor layer 11 is not limited thereto, and the first semiconductor layer 11 may be formed of various other materials.

The active layer 12 may be disposed between the first semiconductor layer 11 and the second semiconductor layer 13. The active layer 12 may include any one structure of a single well structure, a multi-well structure, a single-quantum well structure, a multi-quantum well (MQW) structure, a quantum dot structure, and a quantum line structure, but embodiments are not limited thereto. The active layer 12 may include GaN, InGaN, InAlGaN, AlGaN, or AlN. In addition, various other materials may be used to form the active layer 12.

In case that a voltage equal to or greater than a threshold voltage is applied between the opposite ends of the light emitting element LD, the light emitting element LD may emit light by coupling (or combining) of electron-hole pairs in the active layer 12. Since light emission of the light emitting element LD is controlled based on the foregoing principle, the light emitting element LD may be used as a light source of various light emitting devices as well as a pixel of the display device.

The second semiconductor layer 13 may be disposed on the active layer 12 and include a semiconductor layer having a type different from that of the first semiconductor layer 11. The second semiconductor layer 13 may include an n-type semiconductor layer. For instance, the second semiconductor layer 13 may include an n-type semiconductor layer which includes any one semiconductor material of InAlGaN, GaN, AlGaN, InGaN, and AlN, and is doped with a second conductive dopant such as Si, Ge, or Sn. However, the material for forming the second semiconductor layer 13 is not limited thereto, and the second semiconductor layer 13 may be formed of various other materials.

The electrode layer 14 may be disposed on the first end portion EP1 and/or the second end portion EP2 of the light emitting element LD. Although FIG. 2 illustrates the case where the electrode layer 14 is formed on the first semiconductor layer 11, embodiments are not limited thereto. For example, a separate electrode layer may be further disposed on the second semiconductor layer 13.

The electrode layer 14 may include transparent metal or transparent metal oxide. For example, the electrode layer 14 may include at least one of indium tin oxide (ITO), indium zinc oxide (IZO), and zinc tin oxide (ZTO), but embodiments are not limited thereto. As such, in case that the electrode layer 14 is formed of transparent metal or transparent metal oxide, light generated from the active layer 12 of the light emitting element LD may be emitted out of the light emitting element LD through the electrode layer 14.

An insulating layer INF may be disposed on a surface of the light emitting element LD. The insulating layer INF may be disposed (e.g., directly disposed) on a surface of the first semiconductor layer 11, a surface of the active layer 12, a surface of the second semiconductor layer 13, and/or a surface of the electrode layer 14. The insulating layer INF may expose the first and second end portions EP1 and EP2 of the light emitting element LD that have different polarities. In an embodiment, the insulating layer INF may expose a sidewall of the electrode layer 14 and/or the second semiconductor layer 13 disposed adjacent to the first and second end portions EP1 and EP2 of the light emitting element LD.

The insulating layer INF may prevent the active layer 12 from occurring short-circuit, which is caused by connection with conductive material except the first and second semiconductor layers 11 and 13. For example, the insulating layer INF may minimize a surface defect of the light emitting elements LD. Thus, the lifetime and emission efficiency of the light emitting elements LD may be enhanced or increased.

The insulating film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium dioxide ($TiO_x$). For example, the insulating layer INF may have a double layer structure, and respective layers that form the double layer structure may include different materials. For example, the insulating layer INF may have a double layer structure formed of aluminum oxide ($AlO_x$) and silicon oxide ($SiO_x$), but embodiments are not limited thereto. In an embodiment, the insulating layer INF may be omitted.

A light emitting device including the light emitting element LD described above may be used not only in a display device but also in various devices which requires a light source. For instance, light emitting elements LD may be disposed in each pixel of a display panel, so that the light emitting elements LD may be used as a light source of the pixel. However, the application field of the light emitting element LD is not limited to the above-mentioned examples. For example, the light emitting element LD may also be used in other types of devices such as a lighting device, which requires a light source.

Figure 3:
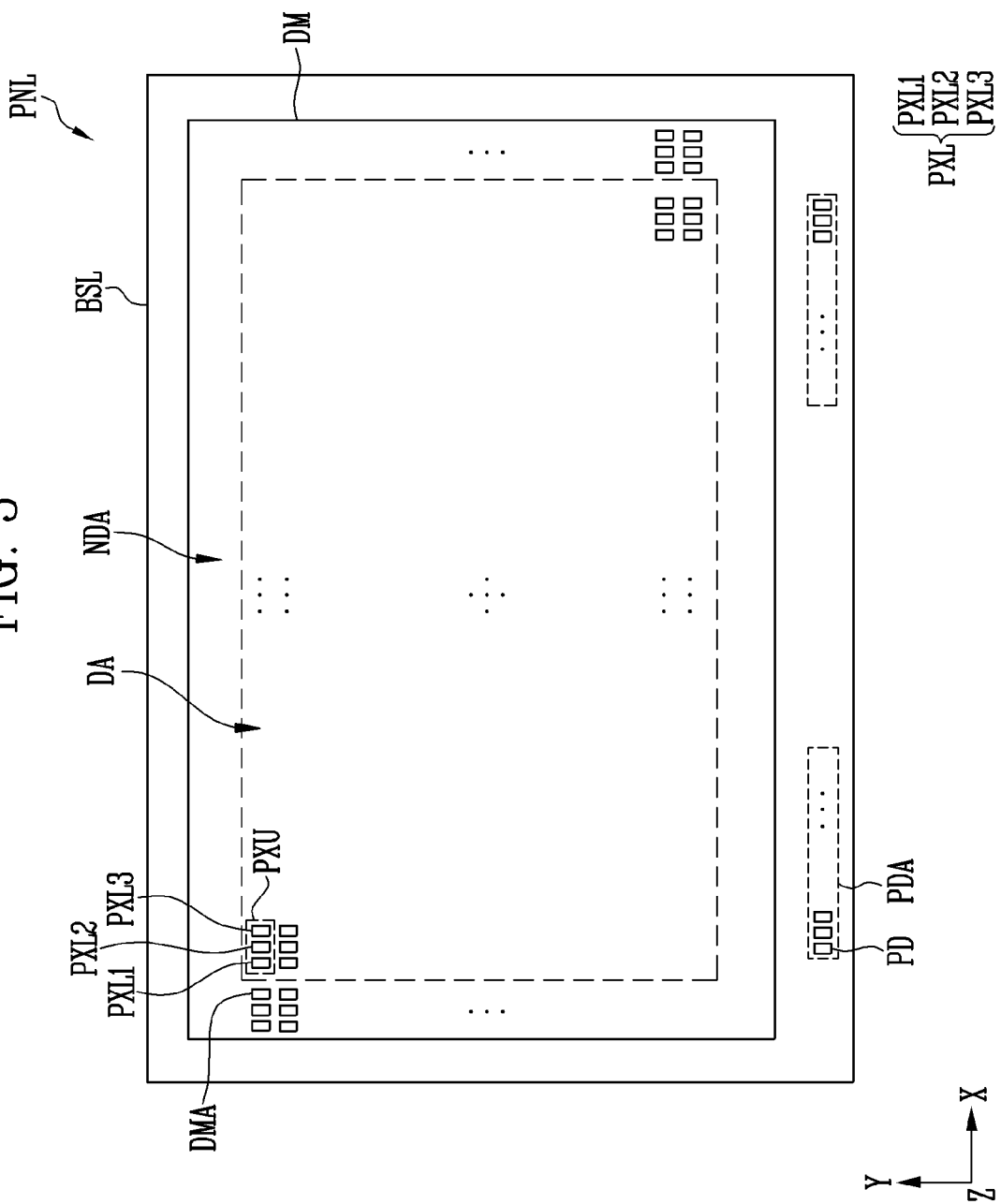
FIG. 3 is a schematic plan view illustrating a display device in accordance with an embodiment.

FIG. 3 is a schematic plan view illustrating a display device in accordance with an embodiment.

FIG. 3 illustrates a display device, particularly, a display panel PNL disposed in the display device, as an example of an electronic device which may use, as a light source, the light emitting element LD described in the embodiments of FIGS. 1 and 2.

For the sake of explanation, FIG. 3 illustrates the structure of the display panel PNL in accordance with an embodiment, focused on a display area DA. In some embodiments, at least one driving circuit (e.g., at least one of a scan driver and a data driver), lines, and/or pads may be further disposed on the display panel PNL.

Referring to FIG. 3, the display panel PNL and a base layer BSL (or a substrate) included in the display panel PNL may include a display area DA for displaying an image, and a non-display area NDA other than the display area DA. The display area DA may form a screen on which an image is displayed. The non-display area NDA may be an area other than the display area DA.

A pixel unit PXU may be disposed in the display area DA. The pixel unit PXU may include a first pixel PXL1, a second pixel PXL2, and/or a third pixel PXL3. Hereinafter, the term "pixel PXL" or "pixels PXL" will be used to arbitrarily designate at least one pixel of the first pixel PXL1, the second pixel PXL2, and the third pixel PXL3, or collectively designate two or more kinds of pixels.

The pixels PXL may be regularly arranged according to a stripe or PENTILE™ arrangement structure. The arrangement structure of the pixels PXL is not limited thereto, and the pixels PXL may be arranged in the display area DA in various structures and/or schemes.

In an embodiment, two or more kinds of pixels PXL which emit light of different colors may be disposed in the display area DA. For example, first pixels PXL1 configured to emit a first color light, second pixels PXL2 configured to emit a second color light, and third pixels PXL3 configured to emit a third color light may be arranged in the display area DA. At least one first pixel PXL1, at least one second pixel PXL2, and at least one third pixel PXL3 that are disposed adjacent to each other may form a pixel unit PXU which may emit light of various colors. For example, each of the first to third pixels PXL1, PXL2, and PXL3 may be a pixel configured to emit a certain color light. In an embodiment, the first pixel PXL1 may be a red pixel configured to emit red light, a second pixel PXL2 may be a green pixel configured to emit green light, and a third pixel PXL3 may be a blue light configured to emit blue light. However, embodiments are not limited thereto.

In an embodiment, the first pixel PXL1, the second pixel PXL2, and the third pixel PXL3 may respectively include light emitting elements configured to emit the same color light, and color conversion layers and/or color filter layers corresponding to different colors may be disposed on the respective light emitting elements so that the first pixel PXL1, the second pixel PXL2, and the third pixel PXL3 may respectively emit the first color light, the second color light, and the third color light. In an embodiment, the first pixel PXL1, the second pixel PXL2, and the third pixel PXL3 may respectively include, as light sources, a light emitting element corresponding to the first color, a light emitting element corresponding to the second color, and a light emitting element corresponding to the third color, so that the pixels may respectively emit the first color light, the second color light, and the third color light. However, the colors, the types, and/or the number of pixels PXL that form each pixel unit PXU are not particularly limited thereto. For example, the color of light to be emitted from each pixel PXL may be changed in various ways.

The pixel PXL may include at least one light source which is driven by a control signal (e.g., a scan signal and a data signal) and/or a power supply (e.g., a first power supply and a second power supply). In an embodiment, the light source may include at least one light emitting element LD in accordance with any one of the embodiments of FIGS. 1 and 2, e.g., subminiature column-type light emitting elements LD having a small size corresponding to a range of the nanometer scale to the micrometer scale. However, embodiments are not limited thereto, and different types of light emitting elements LD may be used as a light source of the pixel PXL.

In an embodiment, each pixel PXL may be formed as an active pixel. However, the types, structures, and/or driving methods of the pixels PXL applicable to the display device are not particularly limited thereto. For example, each pixel PXL may be formed as a pixel for passive or active light emitting display devices which have various structures and/or may be operated in various driving methods.

The non-display area NDA may be disposed around the display area DA. Dummy areas DMA, a pad area PDA, and/or a dam DM may be disposed in the non-display area NDA.

The dummy areas DMA may be formed to minimize a side effect such as a process deviation or a loading effect, which may occur during a process of fabricating the display device, and may be formed to enclose (or surround) the pixels PXL and function as a kind of buffer zone. For example, the process deviation may be minimized by forming, in the dummy area DMA, a pattern that is substantially equal or similar to that of the contact holes and/or electrodes that are formed in the display area DA. Detailed descriptions corresponding to the foregoing will be made with reference to FIG. 9.

The dummy areas DMA may be arranged in rows or columns.

However, the arrangement structure of the dummy areas DMA is not limited thereto. The dummy areas DMA may be arranged in the non-display area NDA in various structures and/or schemes.

A pad PD may be disposed in the pad area PDA. For example, the pad PD may be connected to a driving circuit such as a source driver or a timing controller that is mounted on a circuit substrate. In case that the display panel PNL is connected to source drivers, pad areas PDA may respectively correspond to the source drivers. The pixel PXL may be electrically connected to the pad PD, and receive a data signal from the source driver. In case that an internal circuit (e.g., a gate driver) is disposed in the display panel PNL, the internal circuit may be connected to the pad PD. Although in FIG. 3 the pad PD (or the pad area PDA) is disposed on only a lower side of the display panel PNL, embodiments are not limited thereto. For example, the pad PD may be disposed on each of an upper side and the lower side of the display panel PNL.

The dam DM may be disposed in the non-display area NDA and enclose (or surround) the display area DA. The dam DM may function to prevent an organic layer, photoresist, or the like from flowing outward and overflowing onto circuit elements including the pad area PDA. For example, the dam DM may be disposed between the dummy areas DMA and the pad area PDA.

The dam DM may include organic material such as acrylic resin, epoxy resin, phenolic resin, polyamide resin, polyimide resin, polyester resin, polyphenylene sulfide resin, or benzocyclobutene (BCB). However, embodiments are not limited thereto. The dam DM may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

Figure 4:
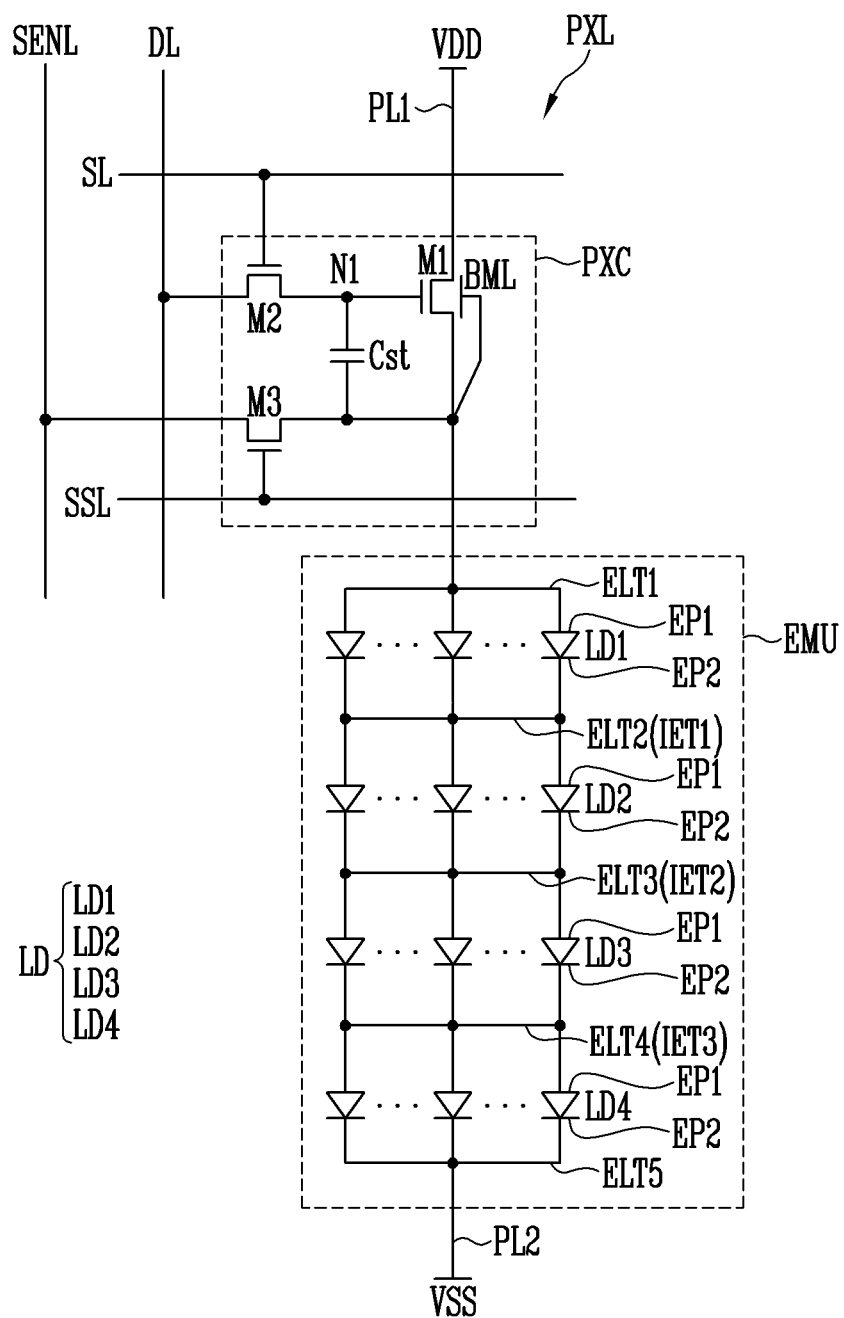
FIG. 4 is a schematic diagram of an equivalent circuit of a pixel in accordance with an embodiment.

FIG. 4 is a schematic diagram of an equivalent circuit of a pixel PXL in accordance with an embodiment.

The pixel PXL illustrated in FIG. 4 may be any one of the first pixel PXL1, the second pixel PXL2, and the third pixel PXL3 that are disposed on the display panel PNL of FIG. 3. The first pixel PXL1, the second pixel PXL2, and the third pixel PXL3 may have substantially identical or similar structures.

Referring to FIG. 4, each pixel PXL may further include an emission component EMU configured to generate light having luminance corresponding to a data signal, and a pixel circuit PXC configured to drive the emission component EMU.

The pixel circuit PXC may be connected between the first power supply VDD and the emission component EMU. For example, the pixel circuit PXC may be connected to a scan line SL and a data line DL of the corresponding pixel PXL, and control the operation of the emission component EMU in response to a scan signal and a data signal supplied from the scan line SL and the data line DL. For example, the pixel circuit PXC may be selectively further connected to a sensing signal line SSL and a sensing line SENL.

The pixel circuit PXC may include at least one transistor and at least one capacitor. For example, the pixel circuit PXC may include a first transistor M1, a second transistor M2, a third transistor M3, and a storage capacitor Cst.

The first transistor M1 may be connected between the first power supply VDD and a first connection electrode ELT1. A gate electrode of the first transistor M1 may be connected to the first node N1. The first transistor M1 may control driving current to be supplied to the emission component EMU in response to a voltage of the first node N1. For example, the first transistor M1 may be a driving transistor configured to control the driving current of the pixel PXL.

In an embodiment, the first transistor M1 may selectively include a bottom conductive layer BML (referred also to as "bottom electrode", "back gate electrode" or "bottom light block layer"). The gate electrode of the first transistor M1 and the bottom conductive layer BML may overlap each other. An insulating layer may be disposed between the gate electrode of the first transistor M1 and the bottom conductive layer BML. In an embodiment, the bottom conductive layer BML may be connected to an electrode of the first transistor M1, e.g., a source or drain electrode of the first transistor M1.

In case that the first transistor M1 includes the bottom conductive layer BML, a back-biasing technique (or a sync technique) may be used, the back-biasing technique being a technique of shifting a threshold voltage of the first transistor M1 in a negative direction or a positive direction by applying a bank-biasing voltage to the bottom conductive layer BML of the first transistor M1 in case that the pixel PXL is driven. For example, a source-sync technique may be used by connecting the bottom conductive layer BML to the source electrode of the first transistor M1, so that the threshold voltage of the first transistor M1 may be shifted in the negative direction or the positive direction, or may be increased or decreased. In case that the bottom conductive layer BML is disposed under a semiconductor pattern that forms a channel of the first transistor M1, the bottom conductive layer BML may function as a light shielding pattern and stabilize operating characteristics of the first transistor M1. However, the function and/or application scheme of the bottom conductive layer BML is not limited thereto.

The second transistor M2 may be connected between the data line DL and the first node N1. A gate electrode of the second transistor M2 may be connected to the scan line SL. In case that a scan signal having a gate-on voltage (e.g., a high-level voltage or a turn-on voltage) is supplied from the scan line SL, the second transistor M2 may be turned on to connect the data line DL to the first node N1.

During each frame period, a data signal of the corresponding frame may be supplied to the data line DL, and the data signal may be transmitted to the first node N1 through the second transistor M2 that is turned on during a period (e.g., in case that the scan signal having the gate-on voltage is supplied to the scan line SL). For example, the second transistor M2 may be a switching transistor configured to transmit each data signal to the interior of the pixel PXL.

One electrode of the storage capacitor Cst may be connected to the first node N1, and the other electrode thereof may be connected to a second electrode of the first transistor M1. The storage capacitor Cst may be charged with a voltage corresponding to a data signal to be supplied to the first node N1 during each frame period.

The third transistor M3 may be connected between the first connection electrode ELT1 (or the second electrode of the first transistor M1) and the sensing line SENL. A gate electrode of the third transistor M3 may be connected to the sensing signal line SSL. The third transistor M3 may transmit a voltage value applied to the first connection electrode ELT1, to the sensing line SENL in response to a sensing signal supplied to the sensing signal line SSL. The voltage value transmitted through the sensing line SENL may be provided to an external circuit (e.g., a timing controller). The external circuit may extract (or measure) information about characteristics of each pixel PXL (e.g., a threshold voltage of the first transistor M1, etc.) based on the provided voltage value. The extracted characteristic information may be used to convert image data to compensate a deviation in characteristics between the pixels PXL.

In an embodiment, the sensing signal may be a signal equal to or different from the above-mentioned scan signal. In case that the sensing signal is a signal equal to the scan signal, the sensing signal line SSL may be selectively integrated with the scan line SL.

Although FIG. 4 illustrates the case where all of the transistors included in the pixel circuit PXC are formed as n-type transistors, embodiments are not certainly limited thereto. For example, at least one of the first, second, and third transistors M1, M2, and M3 may be changed (or modified) to a p-type transistor.

The structure and driving methods of the pixel PXL may be changed (or modified) in various ways. For instance, the pixel circuit PXC may not only be formed as the pixel circuit of the embodiment illustrated in FIG. 4 but may also be formed as a pixel circuit which may have various structures and/or be operated in various driving methods.

For example, the pixel circuit PXC may not include the third transistor M3. For example, the pixel circuit PXC may further include other circuit elements such as a compensation transistor configured to compensate the threshold voltage of the first transistor M1, an initialization transistor configured to initialize the voltage of the first node N1 and/or the first connection electrode ELT1, an emission control transistor configured to control a period during which driving current is supplied to the emission component EMU, and/or a boosting capacitor configured to boost the voltage of the first node N1.

The emission component EMU may include at least one light emitting element LD, e.g., a plurality of light emitting elements LD, connected between the first power supply VDD and the second power supply VSS.

For example, the emission component EMU may include a first connection electrode ELT1 connected to the first power supply VDD by the pixel circuit PXC and the first power line PL1, a fifth connection electrode ELT5 connected to the second power supply VSS by the second power line PL2, and light emitting elements LD connected between the first and fifth connection electrodes ELT1 and ELT5.

The first power supply VDD and the second power supply VSS may have different potentials to drive the light emitting elements LD to emit light. For example, the first power supply VDD may be set as a high-potential power supply voltage, and the second power supply VSS may be set as a low-potential power supply voltage.

In an embodiment, the emission component EMU may include at least one serial stage. Each serial stage may include a pair of electrodes (e.g., two electrodes), and at least one light emitting element LD connected in a forward-bias direction between the pair of electrodes. Here, the number of serial stages that form the emission component EMU and the number of light emitting elements LD that form each serial stage are not particularly limited thereto. For example, the numbers of light emitting elements LD that form the respective serial stages may be identical with or different from each other. The number of light emitting elements LD of each serial stage is not particularly limited thereto.

For example, the emission component EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first serial stage may include a first connection electrode ELT1, a second connection electrode ELT2, and at least one first light emitting element LD1 connected between the first and second connection electrodes ELT1 and ELT2. Each first light emitting element LD1 may be connected in the forward-bias direction between the first and second connection electrodes ELT1 and ELT2. For example, a first end portion EP1 of the first light emitting element LD1 may be connected to the first connection electrode ELT1. A second end portion EP2 of the first light emitting element LD1 may be connected to the second connection electrode ELT2.

The second serial stage may include the second connection electrode ELT2, a third connection electrode ELT3, and at least one second light emitting element LD2 connected between the second and third connection electrodes ELT2 and ELT3. Each second light emitting element LD2 may be connected in the forward-bias direction between the second and third connection electrodes ELT2 and ELT3. For example, a first end portion EP1 of the second light emitting element LD2 may be connected to the second connection electrode ELT2. A second end portion EP2 of the second light emitting element LD2 may be connected to the third connection electrode ELT3.

The third serial stage may include the third connection electrode ELT3, a fourth connection electrode ELT4, and at least one third light emitting element LD3 connected between the third and fourth connection electrodes ELT3 and ELT4. Each third light emitting element LD3 may be connected in the forward-bias direction between the third and fourth connection electrodes ELT3 and ELT4. For example, a first end portion EP1 of the third light emitting element LD3 may be connected to the third connection electrode ELT3. A second end portion EP2 of the third light emitting element LD3 may be connected to the fourth connection electrode ELT4.

The fourth serial stage may include the fourth connection electrode ELT4, a fifth connection electrode ELT5, and at least one fourth light emitting element LD4 connected between the fourth and fifth connection electrodes ELT4 and ELT5. Each fourth light emitting element LD4 may be connected in the forward-bias direction between the fourth and fifth connection electrodes ELT4 and ELT5. For example, a first end portion EP1 of the fourth light emitting element LD4 may be connected to the fourth connection electrode ELT4. A second end portion EP2 of the fourth light emitting element LD4 may be connected to the fifth connection electrode ELT5.

The first electrode of the emission component EMU, e.g., the first connection electrode ELT1, may be an anode electrode of the emission component EMU. The last electrode of the emission component EMU, e.g., the fifth connection electrode ELT5, may be a cathode electrode of the emission component EMU.

The other electrodes of the emission component EMU, e.g., the second connection electrode ELT2, the third connection electrode ELT3, and/or the fourth connection electrode ELT4, each may form an intermediate electrode. For example, the second connection electrode ELT2 may form a first intermediate electrode IET1. The third connection electrode ELT3 may form a second intermediate electrode IET2. The fourth connection electrode ELT4 may form a third intermediate electrode IET3.

In case that the light emitting elements LD are connected to have a serial/parallel structure, power efficiency may be enhanced, compared to the case where the same number of light emitting elements LD are connected only in parallel to each other. For example, in the pixel PXL in which the light emitting elements LD are connected to have the serial/parallel structure, in case that a short-circuit defect or the like occurs in some serial stages, sufficient luminance can be expressed by the light emitting elements LD of the other serial stages, so that the probability of occurrence of a black spot defect in the pixel PXL may be reduced. However, embodiments are not limited thereto. The emission component EMU may be formed by connecting the light emitting elements LD only in series. In another example, the emission component EMU may be formed by connecting the light emitting elements LD only in parallel.

Each of the light emitting elements LD may include a first end portion EP1 (e.g., a p-type end portion) connected to the first power supply VDD via at least one electrode (e.g., the first connection electrode ELT1), the pixel circuit PXC, and/or the first power line PL1, and a second end portion EP2 (e.g., an n-type end portion) connected to the second power supply VSS via at least another electrode (e.g., the fifth connection electrode ELT5), and the second power line PL2. For example, the light emitting elements LD may be connected in the forward-bias direction between the first power supply VDD and the second power supply VSS. The light emitting elements LD connected in the forward-bias direction may form valid light sources of the emission component EMU.

In case that driving current is supplied to the light emitting elements LD through the corresponding pixel circuit PXC, the light emitting elements LD may emit light having luminance corresponding to the driving current. For example, during each frame period, the pixel circuit PXC may supply driving current corresponding to a gray scale value to be expressed in the corresponding frame to the emission component EMU. The light emitting elements LD may emit light having luminance corresponding to the driving current, so that the emission component EMU may express the luminance corresponding to the driving current.

Figure 5:
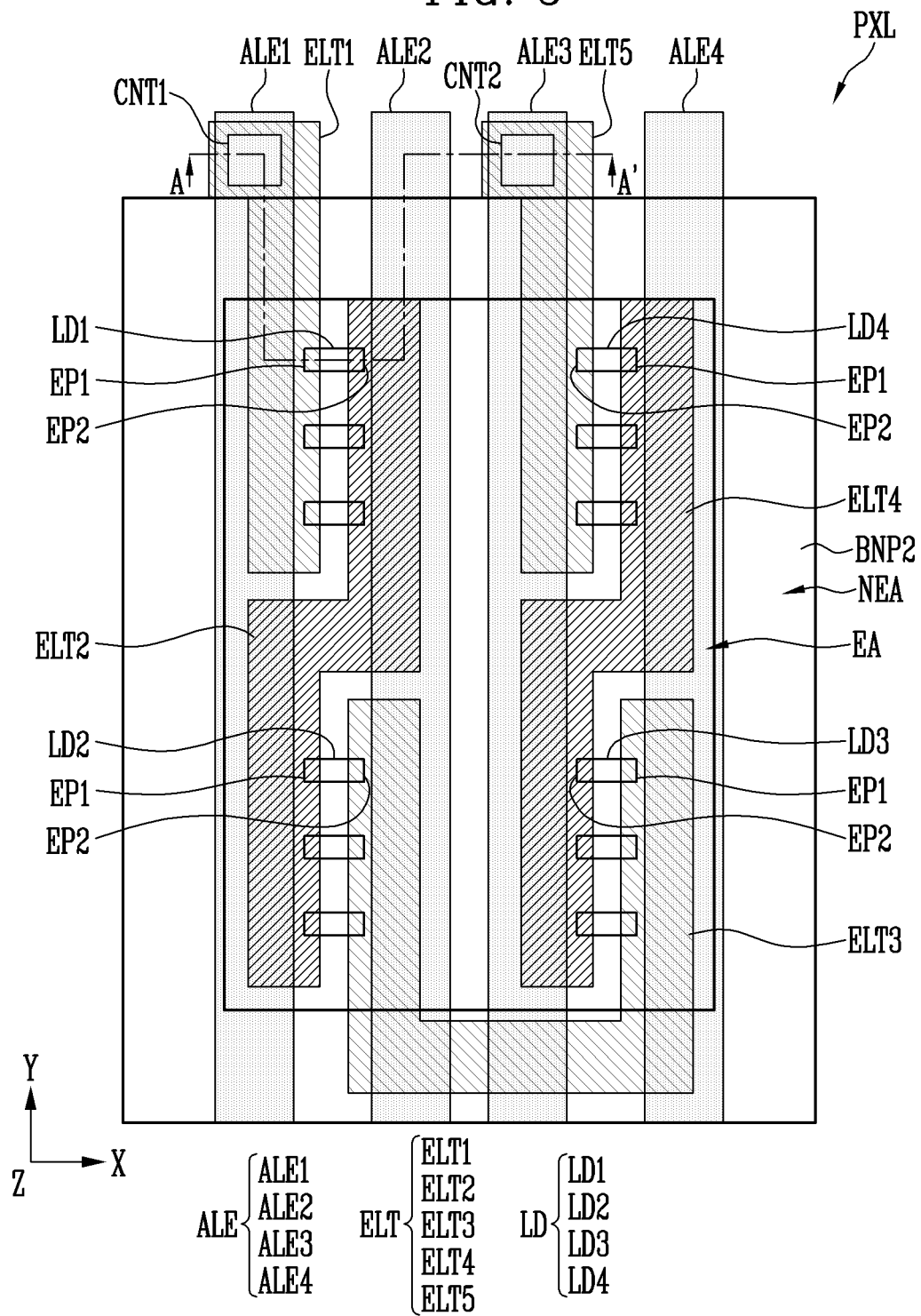
FIG. 5 is a schematic plan view illustrating a pixel in accordance with an embodiment.
Figure 6:
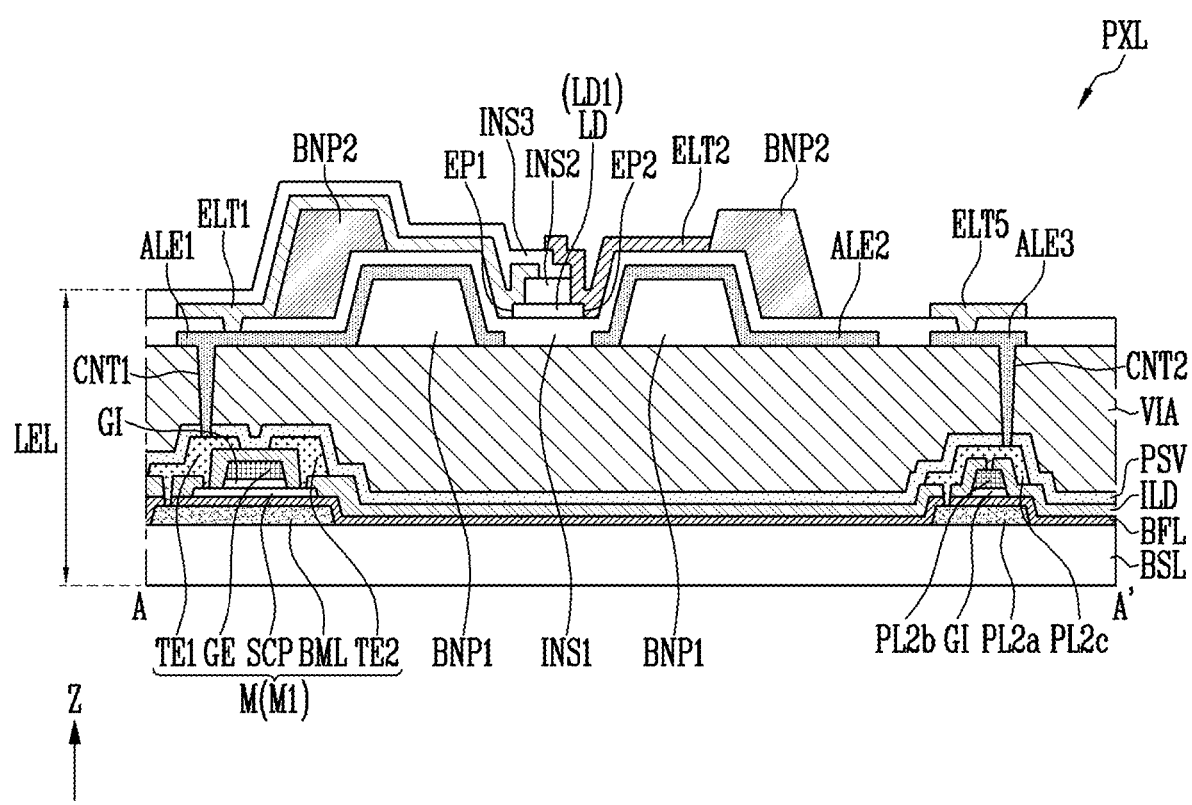
FIG. 6 is a schematic cross-sectional view taken along line A-A' of FIG. 5.

FIG. 5 is a schematic plan view illustrating a pixel PXL in accordance with an embodiment. FIG. 6 is a schematic cross-sectional view taken along line A-A' of FIG. 5.

For example, the pixel PXL of FIG. 5 may be any one of the first to third pixels PXL1, PXL2, and PXL3 that form the pixel unit PXU of FIG. 3, and the first to third pixels PXL1, PXL2, and PXL3 may have substantially identical or similar structures. Although FIG. 5 illustrates an embodiment in which, as illustrated in FIG. 4, each pixel PXL includes light emitting elements LD disposed in four serial stages, the number of serial stages in the pixel PXL may be changed in various ways according to embodiments.

Hereinafter, the term "light emitting element LD" or "light emitting elements LD" will be used to arbitrarily designate at least one light emitting element of the first to fourth light emitting elements LD1, LD2, LD3, and LD4, or collectively designate two or more kinds of light emitting elements. For example, the term "electrode ALE" or "electrodes ALE" will be used to arbitrarily designate at least one of electrodes including the first to fourth electrodes ALE1, ALE2, ALE3, and ALE4. The term "connection electrode ELT" or "connection electrodes ELT" will be used to arbitrarily designate at least one of electrodes including the first to fifth connection electrodes ELT1, ELT2, ELT3, ELT4, and ELT5.

Referring to FIG. 5, each pixel PXL may include an emission area EA and a non-emission area NEA. The emission area EA may be an area which includes light emitting elements LD and is capable of emitting emit light. The non-emission area NEA may enclose (or surround) the emission area EA. The non-emission area NEA may be an area where a second bank pattern layer BNP2 enclosing (or surrounding) the emission area EA is disposed.

The pixels PXL each may include electrodes ALE, light emitting elements LD, and/or connection electrodes ELT. The electrodes ALE may be disposed in at least the emission area EA. The electrodes ALE may extend in a second direction DR2 (e.g., a Y-axis direction) and be spaced apart from each other in a first direction DR1 (e.g., an X-axis direction). The electrodes ALE may extend from the emission area EA to the non-emission area NEA. For example, the first to fourth electrodes ALE1, ALE2, ALE3, and ALE4 each may extend in the second direction DR2 (e.g., the Y-axis direction), and may be successively (or subsequently) disposed at positions spaced apart from each other in the first direction DR1 (e.g., the X-axis direction).

Some of the electrodes ALE may be connected to the pixel circuit (PXC of FIG. 4) and/or a power line through a contact hole. For example, the first electrode ALE1 may be connected to the pixel circuit PXC and/or the first power line PL1 through a contact hole, and the third electrode ALE3 may be connected to the second power line PL2 through a contact hole.

In an embodiment, some of the electrodes ALE may be electrically connected to some of the connection electrodes ELT through a contact hole. For example, the first electrode ALE1 may be electrically connected to the first connection electrode ELT1 through a contact hole. The third electrode ALE3 may be electrically connected to the fifth connection electrode ELT5 through a contact hole.

A pair of electrodes ALE adjacent to each other may be supplied with different signals at the step of aligning the light emitting elements LD. For example, the pair of electrodes ALE may be a pair of alignment electrodes used to align (or dispose) the light emitting elements LD. For example, in case that the first to fourth electrodes ALE1, ALE2, ALE3, and ALE4 are successively (or subsequently) arranged in the first direction DR1 (e.g., the X-axis direction), the first and second electrodes ALE1 and ALE2 may make a pair and be supplied with different alignment signals, and the third and fourth electrodes ALE3 and ALE4 may make a pair and be supplied with different alignment signals.

In an embodiment, the second and third electrodes ALE2 and ALE3 may be supplied with an identical signal at the step of aligning the light emitting elements LD. Although FIG. 5 illustrates that the second and third electrodes ALE2 and ALE3 are separated from each other, the second and third electrodes ALE2 and ALE3 may be integrally or non-integrally connected to each other at the step of aligning the light emitting elements LD.

In an embodiment, first bank pattern layers (BNP1 of FIG. 6) may be disposed under the electrodes ALE. The first bank pattern layers BNP1 may be disposed in at least the emission area EA. The first bank pattern layers BNP1 may extend in the second direction DR2 (e.g., the Y-axis direction) and be spaced apart from each other in the first direction DR1 (e.g., the X-axis direction).

Since the first bank pattern layers BNP1 are disposed under respective partial areas of the electrodes ALE, the respective partial areas of the electrodes ALE may protrude in an upward direction of the pixel PXL (e.g., in the third direction DR3 or the Z-axis direction) in the areas where the respective first bank pattern layers BNP1 are formed. In case that the first bank pattern layers BNP1 and/or the electrodes ALE include reflective material, a reflective wall structure may be formed around the light emitting elements LD. Hence, light emitted from the light emitting elements LD may be emitted in an upward direction of the pixel PXL (e.g., in a frontal direction of the display panel PNL having a viewing angle range), so that the light output efficiency of the display panel PNL may be improved.

The light emitting elements LD may be aligned between a pair of electrodes ALE in each emission area EA. For example, the light emitting elements LD each may be electrically connected between a pair of connection electrodes ELT.

The first light emitting element LD1 may be aligned between the first and second electrodes ALE1 and ALE2. The first light emitting element LD1 may be electrically connected between the first and second connection electrodes ELT1 and ELT2. For example, the first light emitting element LD1 may be aligned in first areas (e.g., upper end areas) of the first and second electrodes ALE1 and ALE2. The first end portion EP1 of the first light emitting element LD1 may be electrically connected to the first connection electrode ELT1. The second end portion EP2 of the first light emitting element LD1 may be electrically connected to the second connection electrode ELT2.

The second light emitting element LD2 may be aligned between the first and second electrodes ALE1 and ALE2. The second light emitting element LD2 may be electrically connected between the second and third connection electrodes ELT2 and ELT3. For example, the second light emitting element LD2 may be aligned in second areas (e.g., lower end areas) of the first and second electrodes ALE1 and ALE2. The first end portion EP1 of the second light emitting element LD2 may be electrically connected to the second connection electrode ELT2. The second end portion EP2 of the second light emitting element LD2 may be electrically connected to the third connection electrode ELT3.

The third light emitting element LD3 may be aligned between the third and fourth electrodes ALE3 and ALE4. The third light emitting element LD3 may be electrically connected between the third and fourth connection electrodes ELT3 and ELT4. For example, the third light emitting element LD3 may be aligned in second areas (e.g., lower end areas) of the third and fourth electrodes ALE3 and ALE4. The first end portion EP1 of the third light emitting element LD3 may be electrically connected to the third connection electrode ELT3. The second end portion EP2 of the third light emitting element LD3 may be electrically connected to the fourth connection electrode ELT4.

The fourth light emitting element LD4 may be aligned between the third and fourth electrodes ALE3 and ALE4. The fourth light emitting element LD4 may be electrically connected between the fourth and fifth connection electrodes ELT4 and ELT5. For example, the fourth light emitting element LD4 may be aligned in first areas (e.g., upper end areas) of the third and fourth electrodes ALE3 and ALE4. The first end portion EP1 of the fourth light emitting element LD4 may be electrically connected to the fourth connection electrode ELT4. The second end portion EP2 of the fourth light emitting element LD4 may be electrically connected to the fifth connection electrode ELT5.

For example, the first light emitting element LD1 may be disposed in a left upper end area of the emission area EA.

The second light emitting element LD2 may be disposed in a left lower end area of the emission area EA. The third light emitting element LD3 may be disposed in a right lower end area of the emission area EA. The fourth light emitting element LD4 may be disposed in a right upper end area of the emission area EA. Here, the arrangement and/or connection structure of the light emitting elements LD may be changed in various ways according to the structure of the emission circuit EMU and/or the number of serial stages.

The connection electrodes ELT each may be disposed in at least the emission area EA, and overlap at least one electrode ALE and/or light emitting element LD. For example, the connection electrodes ELT may be formed on the electrodes ALE and/or the light emitting elements LD such that each of the connection electrodes ELT overlaps the corresponding electrodes ALE and/or the corresponding light emitting elements LD. Thus, the connection electrodes ELT may be electrically connected to the light emitting elements LD.

The first connection electrode ELT1 may be disposed on the first area (e.g., the upper end area) of the first electrode ALE1 and the first end portions EP1 of the first light emitting elements LD1, and electrically connected to the first end portions EP1 of the first light emitting elements LD1.

The second connection electrode ELT2 may be disposed on the first area (e.g., the upper end area) of the second electrode ALE2 and the second end portions EP2 of the first light emitting elements LD1, and electrically connected to the second end portions EP2 of the first light emitting elements LD1. For example, the second connection electrode ELT2 may be disposed on the second area (e.g., the lower end area) of the first electrode ALE1 and the first end portions EP1 of the second light emitting elements LD2, and electrically connected to the first end portions EP1 of the second light emitting elements LD2. For example, the second connection electrode ELT2 may electrically connect the second end portions EP2 of the first light emitting elements LD1 and the first end portions EP1 of the second light emitting elements LD2 to each other in the emission area EA. The second connection electrode ELT2 may have a bent shape. For example, the third connection electrode ELT3 may have a bent or curved structure on a boundary area between an area where at least one first light emitting element LD1 is disposed and an area where at least one second light emitting element LD2 is disposed.

The third connection electrode ELT3 may be disposed on the second area (e.g., the lower end area) of the second electrode ALE2 and the second end portions EP2 of the second light emitting elements LD2, and electrically connected to the second end portions EP2 of the second light emitting elements LD2. For example, the third connection electrode ELT3 may be disposed on the second area (e.g., the lower end area) of the fourth electrode ALE4 and the first end portions EP1 of the third light emitting elements LD3, and electrically connected to the first end portions EP1 of the third light emitting elements LD3. For example, the third connection electrode ELT3 may electrically connect the second end portions EP2 of the second light emitting elements LD2 and the first end portions EP1 of the third light emitting elements LD3 to each other in the emission area EA. The third connection electrode ELT3 may have a bent shape. For example, the third connection electrode ELT3 may have a bent or curved structure on a boundary area between an area where at least one second light emitting element LD2 is disposed and an area where at least one third light emitting element LD3 is disposed.

The fourth connection electrode ELT4 may be disposed on the second area (e.g., the lower end area) of the third electrode ALE3 and the second end portions EP2 of the third light emitting elements LD3, and electrically connected to the second end portions EP2 of the third light emitting elements LD3. For example, the fourth connection electrode ELT4 may be disposed on the first area (e.g., the upper end area) of the fourth electrode ALE4 and the first end portions EP1 of the fourth light emitting elements LD4, and electrically connected to the first end portions EP1 of the fourth light emitting elements LD4. For example, the fourth connection electrode ELT4 may electrically connect the second end portions EP2 of the third light emitting elements LD3 and the first end portions EP1 of the fourth light emitting elements LD4 to each other in the emission area EA. The fourth connection electrode ELT4 may have a bent shape. For example, the fourth connection electrode ELT4 may have a bent or curved structure on a boundary area between an area where at least one third light emitting element LD3 is disposed and an area where at least one fourth light emitting element LD4 is disposed.

The fifth connection electrode ELT5 may be disposed on the first area (e.g., the upper end area) of the third electrode ALE3 and the second end portions EP2 of the fourth light emitting elements LD4, and electrically connected to the second end portions EP2 of the fourth light emitting elements LD4.

For example, the light emitting elements LD aligned between the electrodes ALE may be connected in a desired form by using the connection electrodes ELT. For example, the first light emitting elements LD1, the second light emitting elements LD2, the third light emitting elements LD3, and the fourth light emitting elements LD4 may be successively (or subsequently) connected in series by using the connection electrodes ELT.

Hereinafter, a cross-sectional structure of each pixel PXL will be described in detail based on the first light emitting element LD1, with reference to FIG. 6. FIG. 6 illustrates a light emitting element layer LEL of the pixel PXL. FIG. 6 illustrates a first transistor M1 of various circuit elements that form the pixel circuit (refer to PXC of FIG. 4). In case that there is no need to separately designate the first to third transistors M1, M2, and M3, the term "transistor M" will be collectively used. The structures of the transistors M and/or positions in layers thereof are not limited to those of the embodiment shown in FIG. 6 and may be changed in various ways according to embodiments.

Referring to FIG. 6, the light emitting element layer LEL for the pixels PXL in accordance with an embodiment may include circuit elements including transistors M disposed on the base layer BSL, and various lines connected to the circuit elements. The electrodes ALE, the light emitting elements LD, and/or the connection electrodes ELT that form the emission circuit EMU may be disposed on the circuit elements.

The base layer BSL may form a base and be formed as a rigid or flexible substrate or film. For example, the base layer BSL may be a rigid substrate made of glass or reinforced glass, a flexible substrate (or a thin film) formed of plastic or metal, or at least one insulating layer. The material and/or properties of the base layer BSL is not particularly limited thereto. In an embodiment, the base layer BSL may be substantially transparent. Here, the words "substantially transparent" may mean that light can pass through the substrate at a certain transmissivity or more. In an embodiment, the base layer BSL may be translucent or opaque. In another example, the base layer BSL may include reflective material in some embodiments.

The bottom conductive layer BML and a first power conductive layer PL2a may be disposed on the base layer BSL. The bottom conductive layer BML and the first power conductive layer PL2a may be disposed on the same layer. For example, the bottom conductive layer BML and the first power conductive layer PL2a may be simultaneously formed by the same process, but embodiments are not limited thereto. The first power conductive layer PL2a may form the second power line PL2 described with reference to FIG. 4 or the like.

The bottom conductive layer BML and the first power conductive layer PL2a each may have a single layer structure or a multilayer structure that is formed of molybdenum (Mo), copper (Cu), aluminum (Al), chrome (Cr), gold (Au), titanium (Ti), nickel (Ni), neodymium (Nd), indium (In), tin (Sn), and an oxide or alloy thereof.

A buffer layer BFL may be disposed on the bottom conductive layer BML and the first power conductive layer PL2a. The buffer layer BFL may prevent impurities from diffusing (or permeating) into a circuit element. The buffer layer BFL may be formed as a single layer, or may be formed as multiple layers having at least two or more layers. In case that the buffer layer BFL has a multilayer structure, the respective layers may be formed of the same material or different materials.

A semiconductor pattern layer SCP may be disposed on the buffer layer BFL. For example, the semiconductor pattern layer SCP may include a first area which contacts a first transistor electrode TE1, a second area which contacts a second transistor electrode TE2, and a channel area disposed between the first and second areas. In an embodiment, one of the first and second areas may be a source region, and another one may be a drain region.

In an embodiment, the semiconductor pattern layer SCP may be formed of polysilicon, amorphous silicon, an oxide semiconductor, or the like. The channel area of the semiconductor pattern layer SCP may be an intrinsic semiconductor, which is an undoped semiconductor pattern. Each of the first and second areas of the semiconductor pattern layer SCP may be a semiconductor doped with a dopant.

A gate insulating layer GI may be disposed on the buffer layer BFL and the semiconductor pattern layer SCP. For example, the gate insulating layer GI may be disposed between the semiconductor pattern layer SCP and the gate electrode GE. For example, the gate insulating layer GI may be disposed between the buffer layer BFL and a second power conductive layer PL2b. The gate insulating layer GI may be formed as a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The gate electrode GE of the transistor M and the second power conductive layer PL2b may be disposed on the gate insulating layer GI. The gate electrode GE and the second power conductive layer PL2b may be disposed on the same layer. For example, the gate electrode GE and the second power conductive layer PL2b may be simultaneously formed by the same process, but embodiments are not limited thereto. The gate electrode GE may be disposed on the gate insulating layer GI and may overlap the semiconductor pattern layer SCP in the third direction DR3 (e.g., the Z-axis direction). The second power conductive layer PL2b may be disposed on the gate insulating layer GI and may overlap the first power conductive layer PL2a in the third direction DR3 (e.g., the Z-axis direction). The second power conductive layer PL2b along with the first power conductive layer PL2a may form the second power line PL2 described with reference to FIG. 4 or the like.

The gate electrode GE and the second power conductive layer PL2b each may have a single layer structure or a multilayer structure that is formed of molybdenum (Mo), copper (Cu), aluminum (Al), chrome (Cr), gold (Au), titanium (Ti), nickel (Ni), neodymium (Nd), indium (In), tin (Sn), and an oxide or alloy thereof. For example, the gate electrode GE and the second power conductive layer PL2b each may have a multilayer structure formed by successively or repeatedly stacking titanium (Ti), copper (Cu), and/or indium tin oxide (ITO).

An interlayer insulating layer ILD may be disposed on the gate electrode GE and the second power conductive layer PL2b. For example, the interlayer insulating layer ILD may be disposed between the gate electrode GE and the first and second transistor electrodes TE1 and TE2. For example, the interlayer insulating layer ILD may be disposed between the second power conductive layer PL2b and a third power conductive layer PL2c.

The interlayer insulating layer ILD may be formed as a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The first and second transistor electrodes TE1 and TE2 of the transistor M and the third power conductive layer PL2c may be disposed on the interlayer insulating layer ILD. The first and second transistor electrodes TE1 and TE2 and the third power conductive layer PL2c may be formed of the same material (or the same layer). For example, the first and second transistor electrodes TE1 and TE2 and the third power conductive layer PL2c may be simultaneously formed by the same process, but embodiments are not limited thereto.

The first and second transistor electrodes TE1 and TE2 may overlap the semiconductor pattern layer SCP in the third direction DR3 (e.g., the Z-axis direction). The first and second transistor electrodes TE1 and TE2 may be electrically connected to the semiconductor pattern layer SCP. For example, the first transistor electrode TE1 may be electrically connected with the first area of the semiconductor pattern layer SCP through a contact hole passing through the interlayer insulating layer ILD. For example, the first transistor electrode TE1 may be electrically connected with the bottom conductive layer BML through a contact hole passing through the interlayer insulating layer ILD and the buffer layer BFL. The second transistor electrode TE2 may be electrically connected with the second area of the semiconductor pattern layer SCP through a contact hole passing through the interlayer insulating layer ILD. In an embodiment, any one of the first and second transistor electrodes TE1 and TE2 may be a source electrode, and another one may be a drain electrode.

The third power conductive layer PL2c may overlap the first power conductive layer PL2a and/or the second power conductive layer PL2b in the third direction DR3 (e.g., the Z-axis direction). The third power conductive layer PL2c may be electrically connected to the first power conductive layer PL2a and/or the second power conductive layer PL2b. For example, the third power conductive layer PL2c may be electrically connected to the first power conductive layer PL2a through a contact hole passing through the interlayer insulating layer ILD and the buffer layer BFL. For example, the third power conductive layer PL2c may be electrically connected to the second power conductive layer PL2b through a contact hole passing through the interlayer insulating layer ILD. The third power conductive layer PL2c along with the first power conductive layer PL2a and/or the second power conductive layer PL2b may form the second power line PL2 described with reference to FIG. 4 or the like.

The first and second transistor electrodes TE1 and TE2 and the third power conductive layer PL2c each may have a single layer structure or a multilayer structure that is formed of molybdenum (Mo), copper (Cu), aluminum (Al), chrome (Cr), gold (Au), titanium (Ti), nickel (Ni), neodymium (Nd), indium (In), tin (Sn), and an oxide or alloy thereof.

A passivation layer PSV may be disposed on the first and second transistor electrodes TE1 and TE2 and the third power conductive layer PL2c. The passivation layer PSV may be formed as a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A via layer VIA may be disposed on the passivation layer PSV. The via layer VIA may be formed of organic material for planarizing a stepped structure formed thereunder. For example, the via layer VIA may include organic material such as acrylic resin, epoxy resin, phenolic resin, polyamide resin, polyimide resin, polyester resin, polyphenylene sulfide resin, or benzocyclobutene (BCB). However, embodiments are not limited thereto. The via layer VIA may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The first bank pattern layers BNP1 may be disposed on the via layer VIA. The first bank pattern layers BNP1 may have various shapes according to embodiments. In an embodiment, the first bank pattern layers BNP1 may have a shape protruding from the base layer BSL in the third direction DR3 (e.g., the Z-axis direction). For example, the first bank pattern layers BNP1 may have an inclined surface angled to the base layer BSL at an angle (e.g., a predetermined angle). However, embodiments are not limited thereto. The first bank pattern layers BNP1 may have a sidewall having a curved or stepped shape. For example, the first bank pattern layers BNP1 may have a semi-circular cross-section or a semi-elliptical cross-section.

The electrodes and the insulating layers that are disposed over the first bank pattern layers BNP1 may have shapes corresponding to that of the first bank pattern layers BNP1. For example, the electrodes ALE that are disposed on the first bank pattern layers BNP1 may include inclined surfaces or curved surfaces having shapes corresponding to that of the first bank pattern layers BNP1. Hence, the first bank pattern layers BNP1 along with the electrodes ALE disposed thereon may function as reflectors for guiding light emitted from the light emitting elements LD in the frontal direction of the pixel PXL, i.e., in the third direction DR3 (e.g., the Z-axis direction). Thus, the light output efficiency of the display panel PNL may be enhanced.

The first bank pattern layers BNP1 may include at least one organic material and/or inorganic material. For example, the first bank pattern layers BNP1 may include organic material such as acrylic resin, epoxy resin, phenolic resin, polyamide resin, polyimide resin, polyester resin, polyphenylene sulfide resin, or benzocyclobutene (BCB). However, embodiments are not limited thereto. The first bank pattern layers BNP1 may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The electrodes ALE may be disposed on the via layer VIA and the first bank pattern layers BNP1. The electrodes ALE may be disposed at positions spaced apart from each other in the pixel PXL. The electrodes ALE may be disposed on the same layer. For example, the electrodes ALE may be simultaneously formed by the same process, but embodiments are not limited thereto.

The electrodes ALE may be supplied with alignment signals at the step of aligning the light emitting elements LD. Therefore, an electric field may be formed between the electrodes ALE, so that the light emitting elements LD that are disposed in each of the pixels PXL may be aligned between the electrodes ALE.

The electrode ALE may include at least one conductive material. For example, the electrodes ALE may include at least one conductive material among at least one metal of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, conductive oxide such as indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and a conductive polymer such as PEDOT, but embodiments are not limited thereto.

The first electrode ALE1 may be electrically connected to the first transistor electrode TE1 of the transistor M through a first contact hole CNT1 passing through the via layer VIA and the passivation layer PSV. The third electrode ALE3 may be electrically connected to the third power conductive layer PL2c through a second contact hole CNT2 passing through the via layer VIA and the passivation layer PSV.

A first insulating layer INS1 may be disposed on the electrodes ALE. The first insulating layer INS1 may be formed as a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The second bank pattern layers BNP2 may be disposed on the first insulating layer INS1. The second bank pattern layers BNP2 each may form, at the step of supplying the light emitting elements LD to each pixel PXL, a dam structure for defining an emission area to which the light emitting elements LD are to be supplied. For example, a desired kind and/or amount of light emitting element ink may be supplied to the area defined by the second bank pattern layers BNP2.

The second bank pattern layers BNP2 may include organic material such as acrylic resin, epoxy resin, phenolic resin, polyamide resin, polyimide resin, polyester resin, polyphenylene sulfide resin, or benzocyclobutene (BCB). However, embodiments are not limited thereto. The second bank pattern layers BNP2 may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In an embodiment, the second bank pattern layers BNP2 may include at least one light shielding and/or reflective material. Therefore, a light leakage between adjacent pixels PXL may be prevented by the second bank pattern layers BNP2. For example, the second bank pattern layers BNP2 may include at least one black matrix material and/or color filter material. For instance, the second bank pattern layers BNP2 may be formed in a black opaque pattern which may block transmission of light. In an embodiment, a reflective layer or the like may be formed on a surface (e.g., a sidewall) of the second bank pattern layers BNP2 to increase the light efficiency of each pixel PXL.

The light emitting elements LD may be disposed on the first insulating layer INS1. The light emitting elements LD may be disposed on the first insulating layer INS1 between the electrodes ALE. The light emitting elements LD may be prepared in a diffused form (or a dispersed form) in the light emitting element ink, and supplied to each of the pixels PXL by an inkjet printing process or the like. For example, the light emitting elements LD may be diffused (or dispersed) in a volatile solvent and supplied to each of the pixels PXL. In case that alignment signals are supplied to the electrodes ALE, an electric field may be formed between the electrodes ALE so that the light emitting elements LD may be aligned between the electrodes ALE. After the light emitting elements LD have been aligned, the solvent may be removed by a volatilization process or other processes. Thus, the light emitting elements LD may be reliably arranged between the electrodes ALE.

A second insulating layer INS2 may be disposed on the light emitting elements LD. For example, the second insulating layer INS2 may be disposed (e.g., partially disposed) on the light emitting elements LD so that the first and second end portions EP1 and EP2 of the light emitting elements LD are exposed from the second insulating layer INS2. In case that the second insulating layer INS2 is formed on the light emitting elements LD after the alignment of the light emitting elements LD has been completed, the light emitting elements LD may be prevented from being removed from the aligned positions.

The second insulating layer INS2 may be formed as a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The connection electrodes ELT may be disposed on the first and second end portions EP1 and EP2 of the light emitting elements LD that are exposed from the second insulating layer INS2. The first connection electrode ELT1 may be disposed (e.g., directly disposed) on the first end portions EP1 of the first light emitting elements LD1 and contact the first end portions EP1 of the first light emitting elements LD1.

For example, the second connection electrode ELT2 may be disposed (e.g., directly disposed) on the second end portions EP2 of the first light emitting elements LD1 and contact the second end portions EP2 of the first light emitting elements LD1. For example, the second connection electrode ELT2 may be disposed (e.g., directly disposed) on the first end portions EP1 of the second light emitting elements LD2 and contact the first end portions EP1 of the second light emitting elements LD2. For example, the second connection electrode ELT2 may electrically connect the second end portions EP2 of the first light emitting elements LD1 to the first end portions EP1 of the second light emitting elements LD2.

For example, the third connection electrode ELT3 may be disposed (e.g., directly disposed) on the second end portions EP2 of the second light emitting elements LD2 and contact the second end portions EP2 of the second light emitting elements LD2. For example, the third connection electrode ELT3 may be disposed (e.g., directly disposed) on the first end portions EP1 of the third light emitting elements LD3 and contact the first end portions EP1 of the third light emitting elements LD3. For example, the third connection electrode ELT3 may electrically connect the second end portions EP2 of the second light emitting elements LD2 with the first end portions EP1 of the third light emitting elements LD3.

For example, the fourth connection electrode ELT4 may be disposed (e.g., directly disposed) on the second end portions EP2 of the third light emitting elements LD3 and contact the second end portions EP2 of the third light emitting elements LD3. For example, the fourth connection electrode ELT4 may be disposed (e.g., directly disposed) on the first end portions EP1 of the fourth light emitting elements LD4 and contact the first end portions EP1 of the fourth light emitting elements LD4. For example, the fourth connection electrode ELT4 may electrically connect the second end portions EP2 of the third light emitting elements LD3 with the first end portions EP1 of the fourth light emitting elements LD4.

For example, the fifth connection electrode ELT5 may be disposed (e.g., directly disposed) on the second end portions EP2 of the fourth light emitting elements LD4 and contact the second end portions EP2 of the fourth light emitting elements LD4.

In an embodiment, some of the connection electrodes ELT may be disposed on the same layer. For example, the first connection electrode ELT1, the third connection electrode ELT3, and the fifth connection electrode ELT5 may be disposed on the same layer. For example, the second connection electrode ELT2 and the fourth connection electrode ELT4 may be disposed on the same layer. For instance, the first connection electrode ELT1, the third connection electrode ELT3, and the fifth connection electrode ELT5 may be disposed on the second insulating layer INS2. A third insulating layer INS3 may be disposed on the first connection electrode ELT1, the third connection electrode ELT3, and the fifth connection electrode ELT5. The second connection electrode ELT2 and the fourth connection electrode ELT4 may be disposed on the third insulating layer INS3.

The third insulating layer INS3 may expose the second end portions EP2 of the light emitting elements LD. The connection electrodes ELT may be formed on the second end portions EP2 of the light emitting elements LD that are exposed from the third insulating layer INS3.

In case that the third insulating layer INS3 is disposed between the connection electrodes ELT that are formed as different conductive layers, the connection electrodes ELT may be reliably separated from each other by the third insulating layer INS3, so that electrical stability between the first and second end portions EP1 and EP2 of the light emitting elements LD may be improved.

The connection electrodes ELT may be formed of various transparent conductive materials. For example, the connection electrodes ELT may include at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be substantially transparent or translucent to provide satisfactory transmittance. Hence, light emitted from the first and second end portions EP1 and EP2 of the light emitting elements LD may pass through the connection electrodes ELT and be emitted outside the display panel PNL.

The third insulating layer INS3 may be formed as a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

Figure 7:
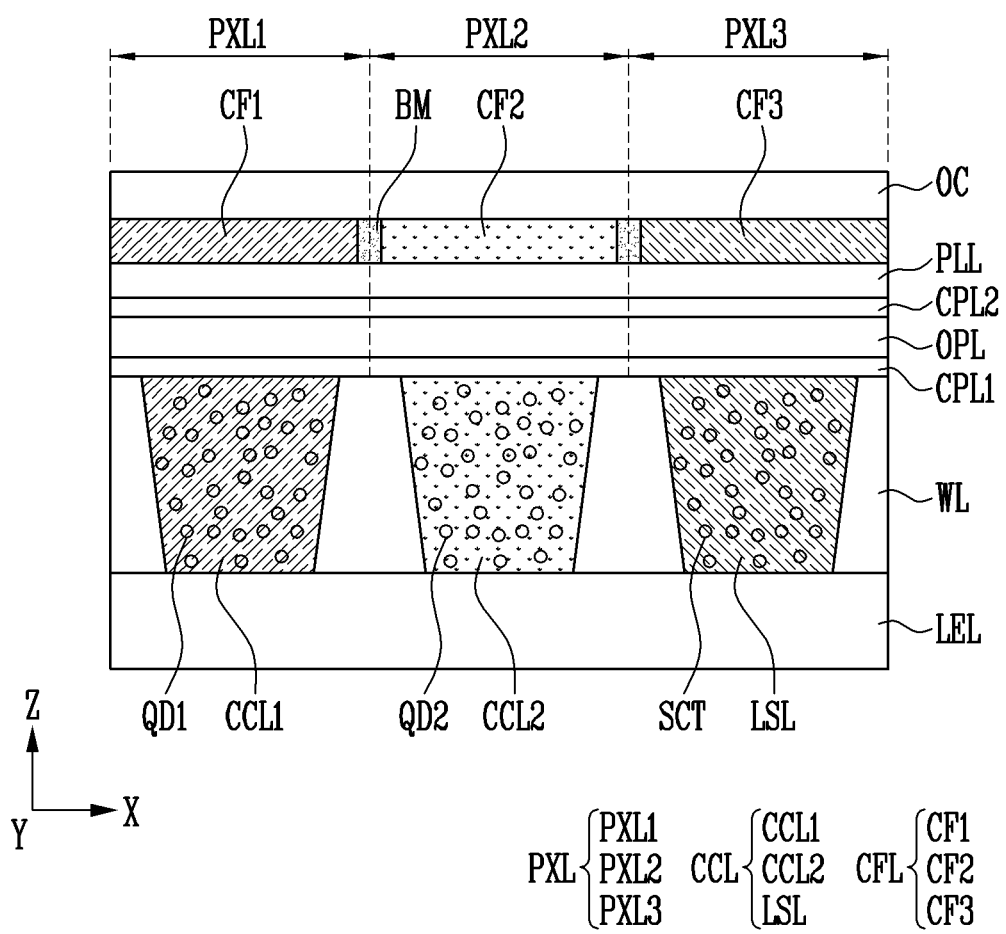
FIG. 7 is a schematic cross-sectional view illustrating first to third pixels in accordance with an embodiment.

FIG. 7 is a schematic cross-sectional view illustrating first to third pixels in accordance with an embodiment.

FIG. 7 illustrates a partition wall WL (e.g., a bank wall), a color conversion layer CCL, an optical layer OPL, and/or a color filter layer CFL which are disposed on the light emitting element layer LEL of the pixel PXL described with reference to FIG. 6.

Referring to FIG. 7, the partition wall WL (e.g., the bank wall) may be disposed on the light emitting element layer LEL for the first to third pixels PXL1, PXL2, and PXL3. For example, the partition wall WL may be disposed between the first to third pixels PXL1, PXL2, and PXL3 or on boundary areas therebetween, and may include openings which respectively overlap the first to third pixels PXL1, PXL2, and PXL3. The openings of the partition wall WL may provide space in which the color conversion layer CCL may be disposed.

The partition wall WL may include organic material such as acrylic resin, epoxy resin, phenolic resin, polyamide resin, polyimide resin, polyester resin, polyphenylene sulfide resin, or benzocyclobutene (BCB). However, embodiments are not limited thereto. The partition wall WL may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In an embodiment, the partition wall WL may include at least one light shielding and/or reflective material. Therefore, a light leakage between adjacent pixels PXL may be prevented. For example, the partition wall WL may include at least one black matrix material and/or color filter material. For instance, the partition wall WL may be formed as a black opaque pattern which may block transmission of light. In an embodiment, a reflective layer or the like may be formed on a surface (e.g., a sidewall) of the partition wall WL to increase the light efficiency of each pixel PXL.

The color conversion layer CCL may be disposed on the light emitting element layer LEL including the light emitting elements LD in the openings of the partition wall WL. The color conversion layer CCL may include a first color conversion layer CCL1 disposed in the first pixel PXL1, a second color conversion layer CCL2 disposed in the second pixel PXL2, and a light scattering layer LSL disposed in the third pixel PXL3.

In an embodiment, the first, second, and third pixels PXL1, PXL2, and PXL3 may include light emitting elements LD configured to emit the same color light. In an embodiment, the first to third pixels PXL1, PXL2, and PXL3 may include light emitting elements LD configured to emit the third color light (e.g., blue light). Since the color conversion layer CCL including color conversion particles is disposed in each of the first to third pixels PXL1, PXL2, and PXL3, a full-color image may be displayed by the display panel PNL.

The first color conversion layer CCL1 may include first color conversion particles for converting the third color light, which is emitted from the light emitting element LD, to the first color light. For example, the first color conversion layer CCL1 may include first quantum dots QD1 which are dispersed in a matrix material such as base resin.

In an embodiment, in case that the light emitting element LD is a blue light emitting element configured to emit blue light and the first pixel PXL1 is a red pixel, the first color conversion layer CCL1 may include the first quantum dots QD1 which convert blue light, which is emitted from the blue light emitting element, to red light. The first quantum dots QD1 may absorb blue light, shift the wavelength thereof according to an energy transition, and emit red light. In case that the first color pixel PXL1 is a pixel of a different color, the first color conversion layer CCL1 may include the first quantum dots QD1 corresponding to the color of the first pixel PXL1.

The second color conversion layer CCL2 may include second color conversion particles for converting the third color light, which is emitted from the light emitting element LD, to the second color light. For example, the second color conversion layer CCL2 may include second quantum dots QD2 which are dispersed in a matrix material such as base resin.

In an embodiment, in case that the light emitting element LD is a blue light emitting element configured to emit blue light and the second pixel PXL2 is a green pixel, the second color conversion layer CCL2 may include the second quantum dots QD2 which convert blue light emitted from the blue light emitting element to green light. The second quantum dots QD2 may absorb blue light, shift the wavelength thereof according to an energy transition, and emit green light. In case that the second color pixel PXL2 is a pixel of a different color, the second color conversion layer CCL2 may include the second quantum dots QD2 corresponding to the color of the second pixel PXL2.

In an embodiment, as blue light having a relatively short wavelength in a visible ray area is incident on each of the first quantum dots QD1 and the second quantum dots QD2, absorption coefficients of the first quantum dot QD1 and the second quantum dot QD2 may be increased. Therefore, eventually, the efficiency of light emitted from the first pixel PXL1 and the second pixel PXL2 may be enhanced, and satisfactory color reproducibility may be improved. For example, since an emission circuit EMU including the first to third pixels PXL1, PXL2, and PXL3 is formed as light emitting elements LD (e.g., blue light emitting elements) configured to emit the same color light, the efficiency of the process of fabricating the display device may be enhanced.

The light scattering layer LSL may be formed to efficiently use the third color light (e.g., blue light) emitted from the light emitting element LD. For example, in case that the light emitting element LD is a blue light emitting element configured to emit blue light and the third pixel PXL3 is a blue pixel, the light scattering layer LSL may include at least one type of light scatter SCT to efficiently use light emitted from the light emitting element LD.

For example, the light scattering layer LSL may include light scatters SCT which are dispersed in a matrix material such as base resin. For instance, the light scattering layer LSL may include a light scatter SCT formed of material such as silica, but the constituent material of the light scatter SCT is not limited thereto. The light scatters SCT may not only be disposed in the third pixel PXL3, but may also be selectively included in the first color conversion layer CCL1 or the second color conversion layer CCL2. In an embodiment, the light scatters SCT may be omitted, and the light scattering layer LSL may be formed of transparent polymer.

A first capping layer CPL1 may be disposed on the color conversion layer CCL. The first capping layer CPL1 may be disposed over the first to third pixels PXL1, PXL2, and PXL3. The first capping layer CPL1 may cover the color conversion layer CCL. The first capping layer CPL1 may prevent the color conversion layer CCL from being damaged or contaminated by permeation of external impurities such as water or air.

The first capping layer CPL1 may be an inorganic layer, and be formed of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), or silicon oxynitride ($SiO_xN_y$).

The optical layer OPL may be disposed on the first capping layer CPL1. The optical layer OPL may function to recycle light emitted from the color conversion layer CCL by total reflection and may enhance light extraction efficiency. Hence, the optical layer OPL may have a relatively low refractive index compared to that of the color conversion layer CCL. For example, the refractive index of the color conversion layer CCL may be in a range of about 1.6 to about 2.0, and the refractive index of the optical layer OPL may be in a range of about 1.1 to about 1.3.

A second capping layer CPL2 may be disposed on the optical layer OPL. The second capping layer CPL2 may be disposed over the first to third pixels PXL1, PXL2, and PXL3. The second capping layer CPL2 may cover the optical layer OPL. The second capping layer CPL2 may prevent the optical layer OPL from being damaged or contaminated by permeation of external impurities such as water or air.

The second capping layer CPL2 may be an inorganic layer, and be formed of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), or silicon oxynitride ($SiO_xN_y$).

A planarization layer PLL may be disposed on the second capping layer CPL2. The planarization layer PLL may be disposed over the first to third pixels PXL1, PXL2, and PXL3.

The planarization layer PLL may include organic material such as acrylic resin, epoxy resin, phenolic resin, polyamide resin, polyimide resin, polyester resin, polyphenylene sulfide resin, or benzocyclobutene (BCB). However, embodiments are not limited thereto. The planarization layer PLL may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The color filter layer CFL may be disposed on the planarization layer PLL. The color filter layer CFL may include color filters CF1, CF2, and CF3 corresponding to the colors of the respective pixels PXL. Since the color filters CF1, CF2, and CF3 corresponding to the respective colors of the first to third pixels PXL1, PXL2, and PXL3 are disposed, a full-color image may be displayed by the display panel PNL.

The color filter layer CFL may include a first color filter CF1 disposed in the first pixel PXL1, a second color filter CF2 disposed in the second pixel PXL2, and a third color filter CF3 disposed in the third pixel PXL3. The first color filter CF1 may selectively pass light emitted from the first pixel PXL1. The second color filter CF2 may selectively pass light emitted from the second pixel PXL2. The third color filter CF3 may selectively pass light emitted from the third pixel PXL3.

In an embodiment, the first color filter CF1, the second color filter CF2, and the third color filter CF3 may be respectively a red color filter, a green color filter, and a blue color filter, but embodiments are not limited thereto. Hereinafter, the term "color filter CF" or "color filters CF" will be used to designate any color filter among the first color filter CF1, the second color filter CF2, and the third color filter CF3, or collectively designate two or more kinds of color filters.

The first color filter CF1 may overlap the light emitting element layer LEL (or the light emitting elements LD) of the first pixel PXL1 and the first color conversion layer CCL1 in the third direction DR3 (e.g., the Z-axis direction). The first color filter CF1 may include color filter material for selectively passing the first color light (e.g., red light) therethrough. For example, in case that the first pixel PXL1 is a red pixel, the first color filter CF1 may include red color filter material.

The second color filter CF2 may overlap the light emitting element layer LEL (or the light emitting elements LD) of the second pixel PXL2 and the second color conversion layer CCL2 in the third direction DR3 (e.g., the Z-axis direction). The second color filter CF2 may include color filter material for selectively passing the second color light (e.g., green light) therethrough. For example, in case that the second pixel PXL2 is a green pixel, the second color filter CF2 may include green color filter material.

The third color filter CF3 may overlap the light emitting element layer LEL (or the light emitting elements LD) of the third pixel PXL3 and the light scattering layer LSL in the third direction DR3 (e.g., the Z-axis direction). The third color filter CF3 may include color filter material for selectively passing the third color light (e.g., blue light) therethrough. For example, in case that the third pixel PXL3 is a blue pixel, the third color filter CF3 may include blue color filter material.

A light shielding layer BM may be further disposed between the first to third color filters CF1, CF2, and CF3. In case that the light shielding layer BM is formed between the first to third color filters CF1, CF2, and CF3, a color mixing defect which is visible (or recognized) from a front surface or side surface of the display device may be prevented. The material of the light shielding layer BM is not limited thereto, and various light shielding materials may be used to form the light shielding layer BM. For example, the light shielding layer BM may be implemented by stacking the first to third color filters CF1, CF2, and CF3 each other.

An overcoat layer OC may be disposed on the color filter layer CFL. The overcoat layer OC may be disposed over the first to third pixels PXL1, PXL2, and PXL3. The overcoat layer OC may cover a lower component including the color filter layer CFL. The overcoat layer OC may prevent water or air from permeating the lower component. For example, the overcoat layer OC may protect the lower component from foreign material such as dust.

The overcoat layer OC may include organic material such as acrylic resin, epoxy resin, phenolic resin, polyamide resin, polyimide resin, polyester resin, polyphenylene sulfide resin, or benzocyclobutene (BCB). However, embodiments are not limited thereto. The overcoat layer OC may include various inorganic materials including silicon oxide ($SiO_x$), silicon nitride ($SiN_x$), silicon oxynitride ($SiO_xN_y$), aluminum nitride (AlN$_x$), aluminum oxide (AlO$_x$), zirconium oxide (ZrO$_x$), hafnium oxide (HfO$_x$), and titanium oxide (TiO$_x$).

Figure 8:
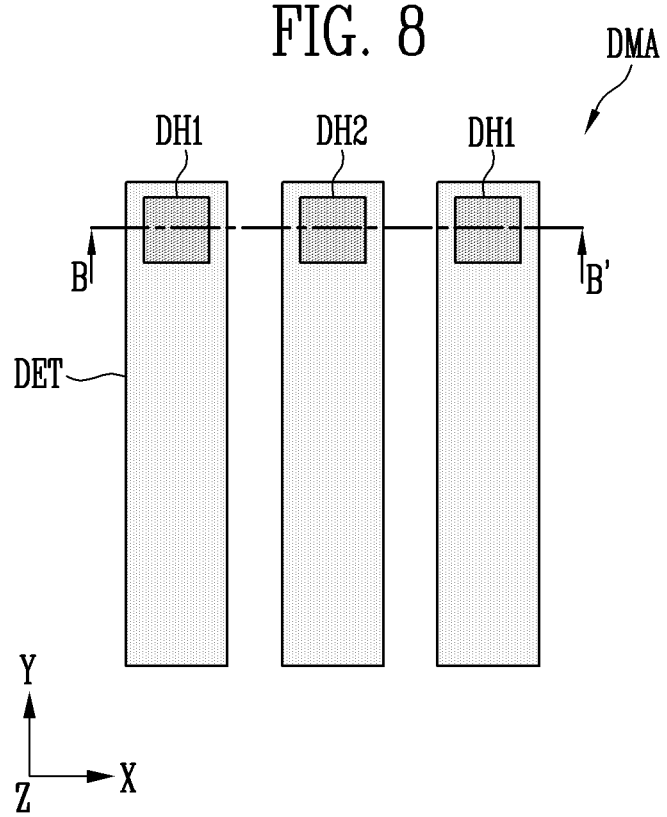
FIG. 8 is a schematic plan view illustrating a dummy area in accordance with an embodiment.
Figure 9:
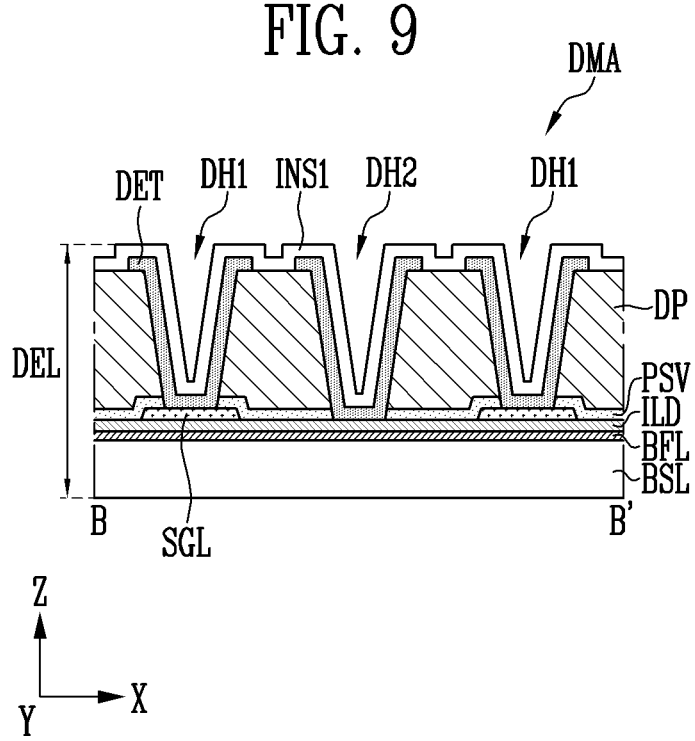
FIG. 9 is a schematic cross-sectional view taken along line B-B' of FIG. 8.
Figure 10:
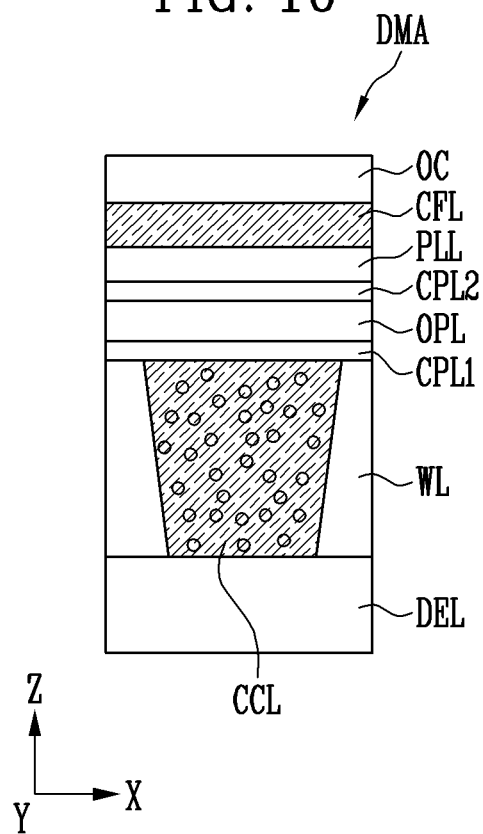
FIG. 10 is a schematic cross-sectional view illustrating a dummy area in accordance with an embodiment.

FIG. 8 is a schematic plan view illustrating a dummy area DMA in accordance with an embodiment. FIG. 9 is a schematic cross-sectional view taken along line B-B' of FIG. 8. FIG. 10 is a schematic cross-sectional view illustrating the dummy area DMA in accordance with an embodiment. FIG. 9 illustrates a dummy element layer DEL of the dummy area DMA. FIG. 10 illustrates a partition wall WL (e.g., a bank wall), a color conversion layer CCL, an optical layer OPL, a color filter layer CFL, and/or the like which are disposed on the dummy element layer DEL of FIG. 9.

Referring to FIGS. 8 and 9, the dummy element layer DEL may include signal lines SGL, dummy pattern layers DP (e.g., dummy via layers), and/or dummy electrodes DET that are disposed on the base layer BSL.

The signal lines SGL may be disposed between the interlayer insulating layer ILD and the passivation layer PSV. The signal lines SGL and the first and second transistor electrodes TE1 and TE2 and/or the third power conductive layer PL2c may be disposed on the same layer. For example, the signal lines SGL, the first and second transistor electrodes TE1 and TE2, and/or the third power conductive layer PL2c may be simultaneously formed by the same process, but embodiments are not limited thereto. The signal lines SGL each may have a single layer structure or a multilayer structure that is formed of molybdenum (Mo), copper (Cu), aluminum (Al), chrome (Cr), gold (Au), titanium (Ti), nickel (Ni), neodymium (Nd), indium (In), tin (Sn), and an oxide or alloy thereof. For example, the signal lines SGL may extend from the pad component PD and be electrically connected to the pixels PXL to supply control signals or power to the pixels PXL. For example, the signal lines SGL, the first and second transistor electrodes TE1 and TE2, and/or the third power conductive layer PL2c may be simultaneously formed of the same material.

The dummy pattern layers DP may be disposed on the passivation layer PSV. The dummy pattern layers DP and the via layer VIA may be disposed on the same layer (e.g., a first same layer). For example, the dummy pattern layers DP and the via layer VIA may be simultaneously formed by the same process, but embodiments are not limited thereto. For example, the dummy pattern layers DP and the via layer VIA may be formed of the same material (e.g., a first same material).

The dummy pattern layers DP may include organic material such as acrylic resin, epoxy resin, phenolic resin, polyamide resin, polyimide resin, polyester resin, polyphenylene sulfide resin, or benzocyclobutene (BCB). However, embodiments are not limited thereto. The dummy pattern layers DP may include various inorganic materials including silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), or titanium oxide (TiO$_x$).

The dummy pattern layers DP may include dummy holes DH1 and DH2. The dummy holes DH1 and DH2 may include a first dummy hole DH1 that exposes the signal lines SGL, and a second dummy hole DH2 other than the first dummy hole DH1. The first dummy hole DH1 and the second dummy hole DH2 may be spaced apart from each other. Although FIGS. 8 and 9 illustrate the case where the second dummy hole DH2 is formed between adjacent first dummy holes DH1, the arrangement of the dummy holes DH1 and DH2 is not limited thereto.

The dummy holes DH1 and DH2 may be simultaneously formed by the same process as that of the first contact hole CNT1 and/or the second contact hole CNT2, but embodiments are not limited thereto. The size of each of the dummy holes DH1 and DH2 may be substantially the same as that of the first contact hole CNT1 and/or the second contact hole CNT2, but embodiments are not limited thereto. As such, since the dummy holes DH1 and DH2 each having a shape substantially identical or similar to that of the first and second contact holes CNT1 and CNT2 in the display area DA are formed in the dummy area DMA, the process deviation may be minimized. Therefore, the uniformity of the first and second contact holes CNT1 and CNT2 formed in the display area DA may be improved.

The dummy electrodes DET may be disposed on the dummy pattern layers DP. The dummy electrodes DET and the electrodes ALE may be disposed on the same layer (e.g., a second same layer). For example, the dummy electrodes DET and the electrodes ALE may be simultaneously formed by the same process, but embodiments are not limited thereto. For example, the dummy electrodes DET and the electrodes ALE may be formed of the same material (e.g., a second same material).

The dummy electrodes DET may include at least one conductive material. For example, the dummy electrodes DET may include at least one material among at least one metal of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, conductive oxide such as indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and a conductive polymer such as PEDOT, but embodiments are not limited thereto.

The dummy electrodes DET may cover the dummy holes DH1 and DH2. For example, the dummy electrodes DET may be disposed on the signal lines SGL exposed through the first dummy hole DH1 and protect the signal lines SGL. Thus, the signal lines SGL may be protected from being damaged during a subsequent process. The dummy electrodes DET may contact the signal lines SGL through contact holes that pass through the first dummy hole DH1 of the dummy pattern layers DP and the passivation layer PSV, but embodiments are not limited thereto.

The dummy electrodes DET may extend in the second direction DR2 (e.g., the Y-axis direction) and be spaced apart from each other in the first direction DR1 (e.g., the X-axis direction). For example, the dummy electrodes DET and the electrodes ALE may extend in the same direction. For example, the dummy electrodes DET and the electrodes ALE may be disposed in substantially parallel. As such, since the dummy electrodes DET each having a shape substantially identical or similar to that of the electrodes ALE in the display area DA is formed in the dummy area DMA, the process deviation may be minimized. Therefore, the uniformity of the electrodes ALE formed in the display area DA may be improved.

An insulating layer may be disposed on the dummy electrodes DET. For example, the first insulating layer INS1 may be disposed on the dummy electrodes DET. The first insulating layer INS1 may cover the dummy electrodes DET and the dummy pattern layers DP exposed from the dummy electrodes DET.

Referring to FIG. 10, the dummy area DMA may correspond to a dummy pixel, and include the same configuration as that of the pixels PXL in the display area DA. For example, the color conversion layer CCL disposed in the opening of the partition wall WL (e.g., the bank wall) may be disposed on the dummy element layer DEL including the dummy pattern layers DP. For example, the color conversion layer CCL may overlap the dummy pattern layers DP. The color conversion layer CCL may include the first color conversion layer CCL1, the second color conversion layer CCL2, and/or the light scattering layer LSL that has been described above. The first capping layer CPL1, the optical layer OPL, the second capping layer CPL2, and/or the planarization layer PLL that has been described above may be formed on the color conversion layer CCL. The color filter layer CFL may be disposed on the planarization layer PLL. The color filter layer CFL may include the first color filter CF1, the second color filter CF2, and the third color filter CF3 that has been described above. The overcoat layer OC may be disposed on the color filter layer CFL. Although FIG. 10 illustrates the case where the dummy area DMA has the same configuration as that of the pixel PXL, embodiments are not limited thereto. For example, at least some of the partition wall WL (e.g., the bank wall), the color conversion layer CCL, the first capping layer CPL1, the optical layer OPL, the second capping layer CPL2, the planarization layer PLL, the color filter layer CFL, and the overcoat layer OC may be omitted from the dummy area DMA.

Since the dummy holes DH1 and DH2 and/or the dummy electrodes DET each having a shape substantially identical or similar to that of the first and second contact holes CNT1 and CNT2 and/or the electrodes ALE in the display area DA is formed in the dummy area DMA, the process deviation may be minimized. Therefore, the uniformity of the first and second contact holes CNT1 and CNT2 and/or the electrodes ALE that are formed in the display area DA may be improved.

Hereinafter, another example will be described. In descriptions of the following embodiment, like reference numerals will be used to designate the above-described configurations and the same components, and redundant explanation thereof will be omitted or simplified for descriptive convenience.

Figure 11:
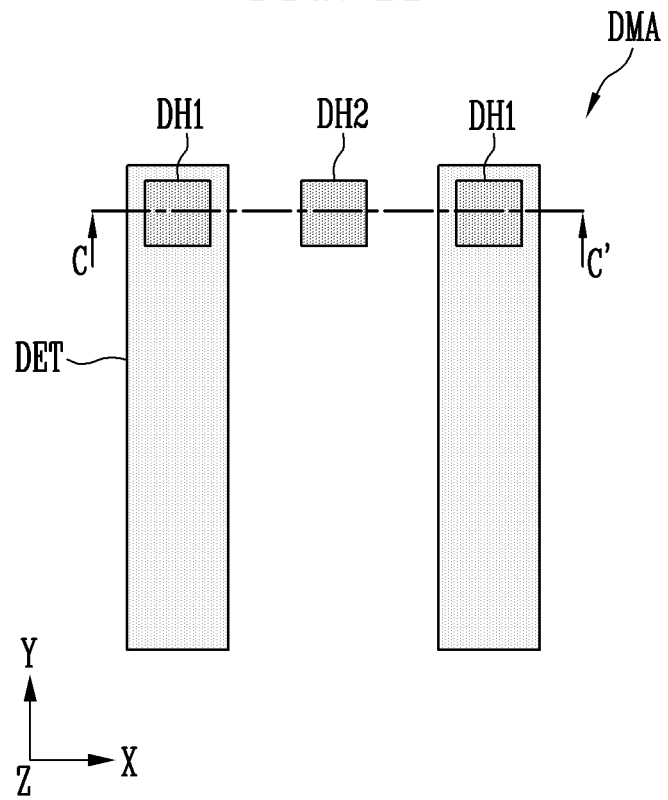
FIG. 11 is a schematic plan view illustrating a dummy area in accordance with an embodiment.
Figure 12:
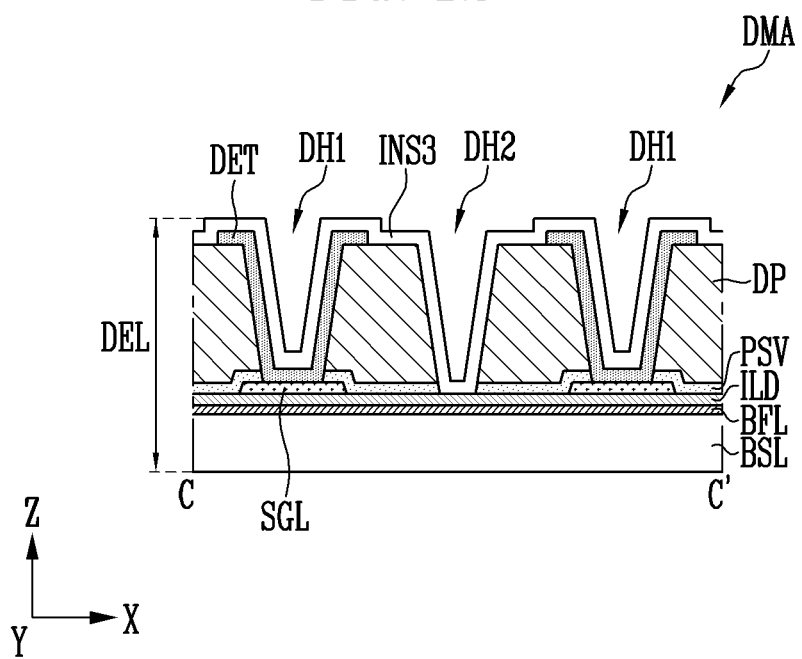
FIG. 12 is a schematic cross-sectional view taken along line C-C' of FIG. 11.

FIG. 11 is a schematic plan view illustrating a dummy area DMA in accordance with an embodiment. FIG. 12 is a schematic cross-sectional view taken along line C-C' of FIG. 11.

The dummy area DMA in accordance with the embodiment is different from the embodiment of FIGS. 1 to 10 in that the dummy electrode DET disposed on the second dummy hole DH2 is partially removed.

Referring to FIGS. 11 and 12, the dummy electrodes DET may be formed (e.g., partially formed) on the first dummy holes DH1. The dummy electrodes DET may not be formed on the second dummy holes DH2. For example, the dummy electrodes DET may not overlap the second dummy hole DH2. For example, the dummy electrodes DET may be apart from (or offset from) the second dummy hole DH2. As such, since the dummy electrodes DET are partially removed, water permeation may be prevented.

An insulating layer may be disposed on the dummy electrodes DET. For example, the third insulating layer INS3 may be disposed on the dummy electrodes DET. The third insulating layer INS3 may cover both the dummy electrodes DET that are disposed on the first dummy holes DH1. For example, the third insulating layer INS3 may cover the first dummy holes DH1 and the second dummy hole DH2.

The other configuration of the dummy area DMA has been described in detail with reference to FIGS. 8 to 10, and redundant description thereof will be omitted for descriptive convenience.

Hereinafter, a method of fabricating the display device in accordance with an embodiment will be described.

FIGS. 13 to 24 are schematic cross-sectional views illustrating, by process steps, a method of fabricating the display device in accordance with an embodiment. FIGS. 13 to 24 are schematic cross-sectional views for describing the method of fabricating the display device based on FIGS. 6 to 9. Like references will be used to designate substantially the same components as those of the embodiment of FIGS. 6 to 9, and detailed explanation thereof will be omitted for descriptive convenience.

Figure 13:
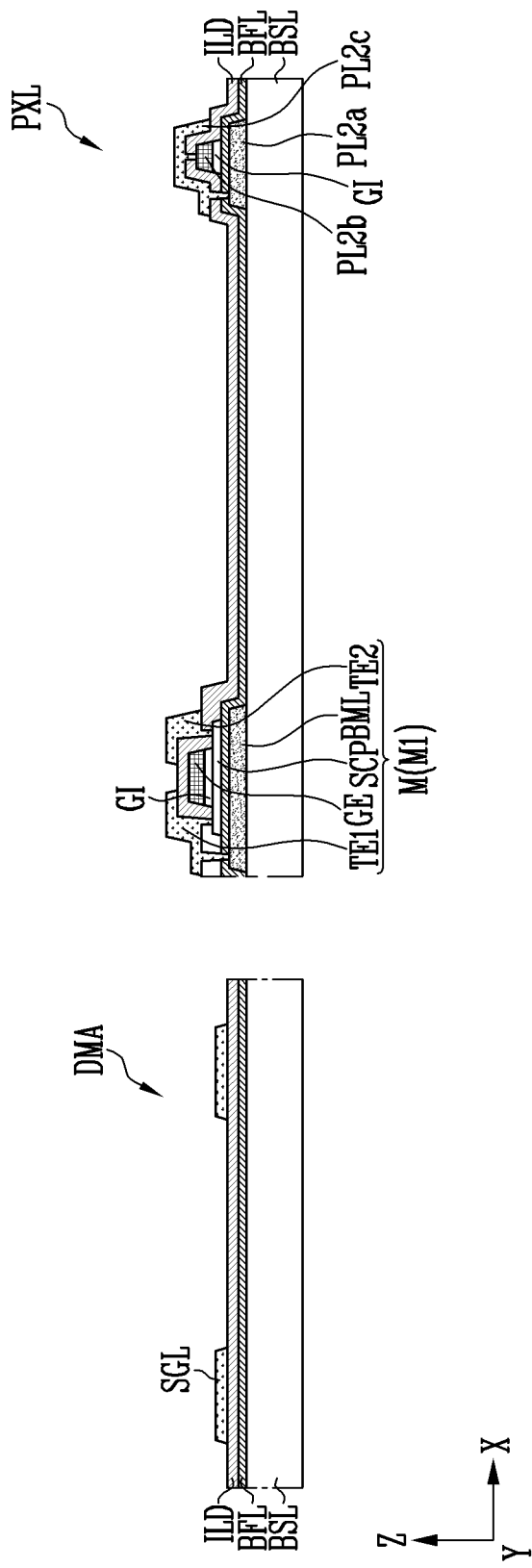

Referring to FIG. 13, the signal lines SGL may be formed in the dummy area DMA. The first and second transistor electrodes TE1 and TE2 and/or the third power conductive layer PL2c may be formed in the pixel PXL. The signal lines SGL, the first and second transistor electrodes TE1 and TE2, and/or the third power conductive layer PL2c may be formed on the interlayer insulating layer ILD of the base layer BSL. The signal lines SGL, the first and second transistor electrodes TE1 and TE2, and/or the third power conductive layer PL2c may be simultaneously formed by the same process.

Referring to FIG. 14, the passivation layer PSV may be thereafter formed on the signal lines SGL, the first and second transistor electrodes TE1 and TE2, and/or the third power conductive layer PL2c. The passivation layer PSV may be formed over the dummy area DMA and the pixel PXL.

Figure 15:
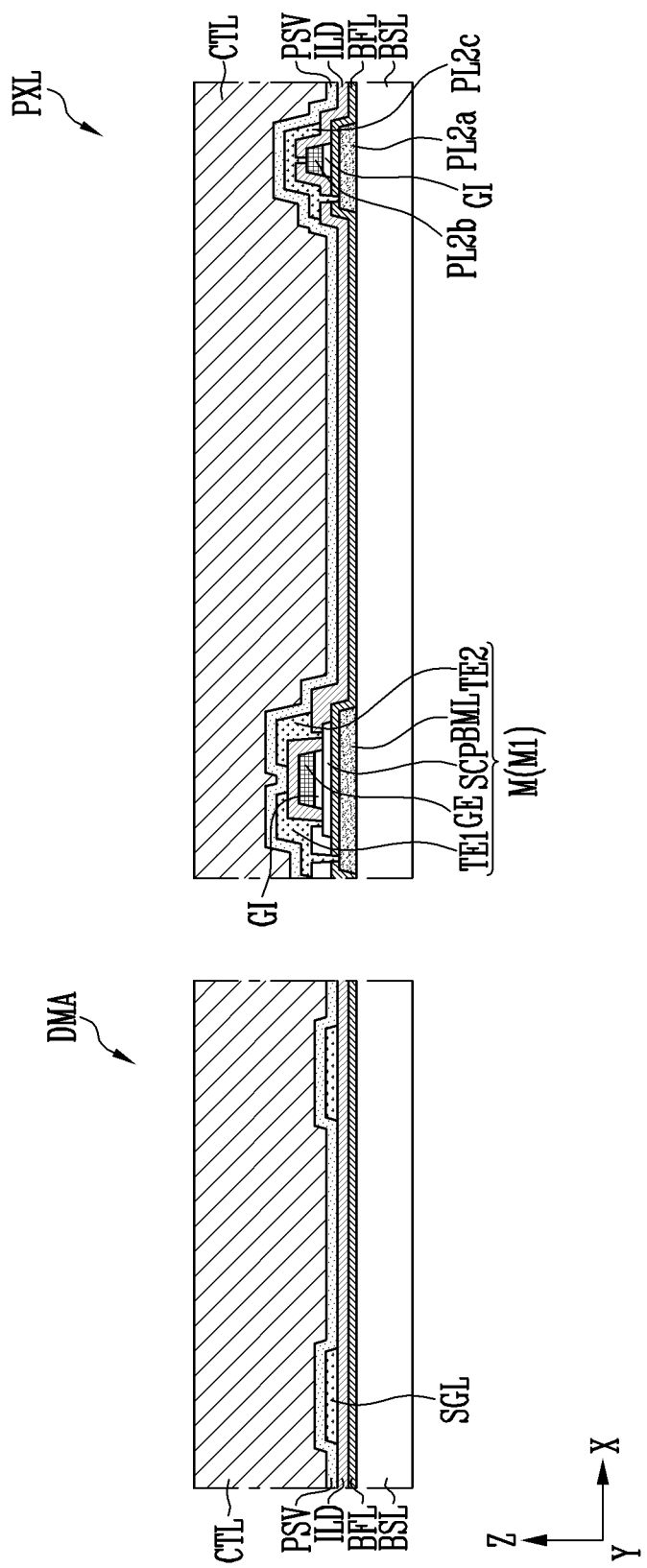

Referring to FIG. 15, a coating layer CTL may be formed on the passivation layer PSV. The coating layer CTL may be formed to cover the dummy area DMA and the pixel PXL. The coating layer CTL may include organic material such as acrylic resin, epoxy resin, phenolic resin, polyamide resin, polyimide resin, polyester resin, polyphenylene sulfide resin, or benzocyclobutene (BCB). However, embodiments are not limited thereto. The coating layer CTL may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

Figure 16:
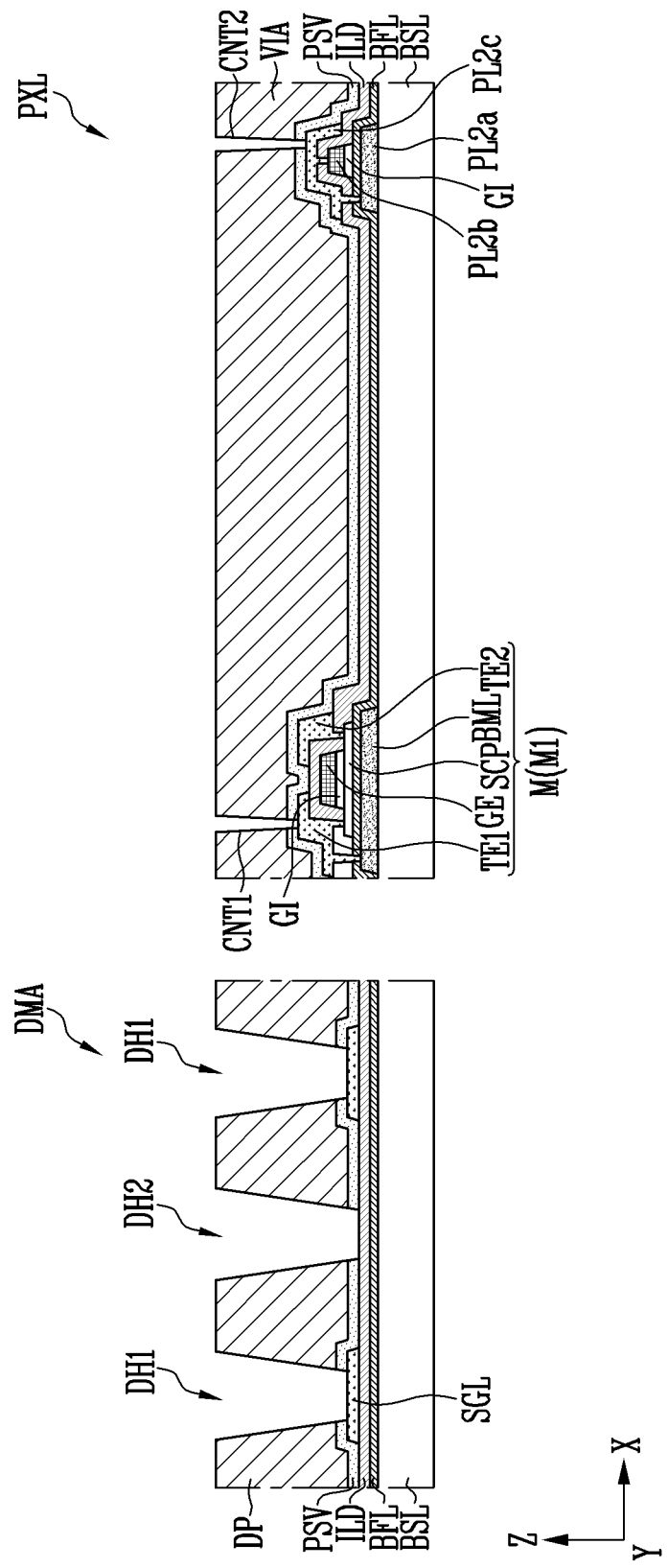

Referring to FIG. 16, the coating layer CTL may be etched so that the dummy pattern layers DP (as the dummy via layers) are formed in the dummy area DAM and the via layer VIA is formed in the pixel PXL. During the process of etching the coating layer CTL, dummy holes DH1 and DH2 may be formed in the dummy pattern layers DP. In an embodiment, during a process of forming the dummy holes DH1 and DH2, the passivation layer PSV disposed thereunder may be etched so that the signal lines SGL may be exposed (e.g., partially exposed). For example, the dummy holes DH1 and DH2 may include a first dummy hole DH1 that exposes the signal lines SGL, and a second dummy hole DH2 other than the first dummy hole DH1. The first dummy hole DH1 and the second dummy hole DH2 may be spaced apart from each other (e.g., in the X-axis direction).

For example, during the process of etching the coating layer CTL, the first and second contact holes CNT1 and CNT2 may be formed in the via layer VIA. In an embodiment, during the process of forming the first and second contact holes CNT1 and CNT2, the passivation layer PSV disposed thereunder may be etched so that the first and second transistor electrodes TE1 and TE2 and/or the third power conductive layer PL2c may be exposed (e.g., partially exposed). For example, the first contact hole CNT1 may expose the first transistor electrode TE1. The second contact hole CNT2 may expose the third power conductive layer PL2c. The dummy holes DH1 and DH2 of the dummy pattern layers DP and the first contact hole CNT1 and/or the second contact hole CNT2 of the via layer VIA may be simultaneously formed during the same process. The size of each of the dummy holes DH1 and DH2 may be substantially the same as that of the first contact hole CNT1 and/or the second contact hole CNT2, but embodiments are not limited thereto. As such, since the dummy holes DH1 and DH2 each having a shape substantially identical or similar to that of the first and second contact holes CNT1 and CNT2 in the display area DA may be formed in the dummy area DMA, the process deviation may be minimized. Therefore, the uniformity of the first and second contact holes CNT1 and CNT2 formed in the display area DA may be improved.

Figure 17:
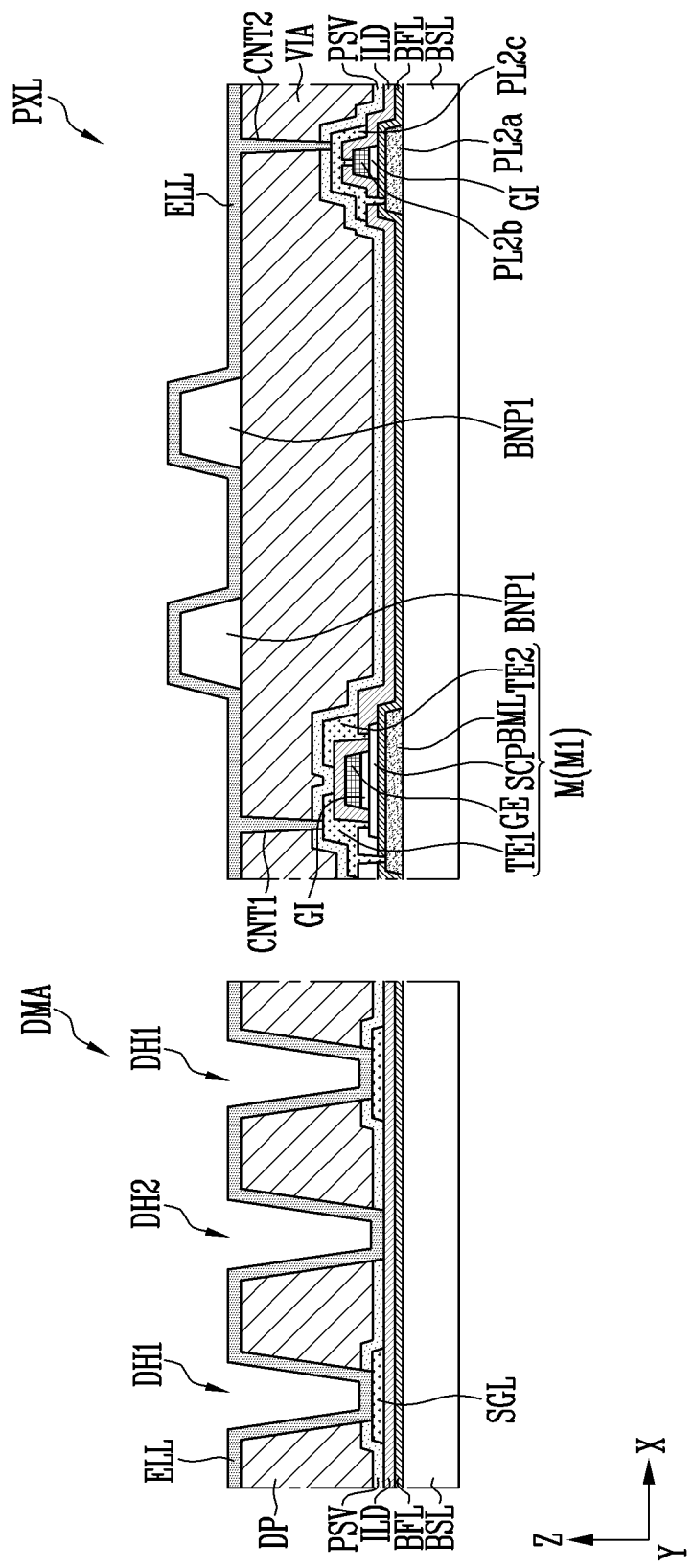

Referring to FIG. 17, an electrode layer ELL may be thereafter formed on the dummy pattern layers DP and the via layer VIA. The electrode layer ELL may be formed over the dummy area DMA and the pixel PXL. In an embodiment, the first bank pattern layers BNP1 may be first formed on the via layer VIA, and the electrode layer ELL may be formed on the first bank pattern layers BNP1.

The electrode layer ELL may include at least one conductive material. For example, the electrode layer ELL may include at least one conductive material among at least one metal of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, conductive oxide such as indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and a conductive polymer such as PEDOT, but embodiments are not limited thereto.

Figure 18:
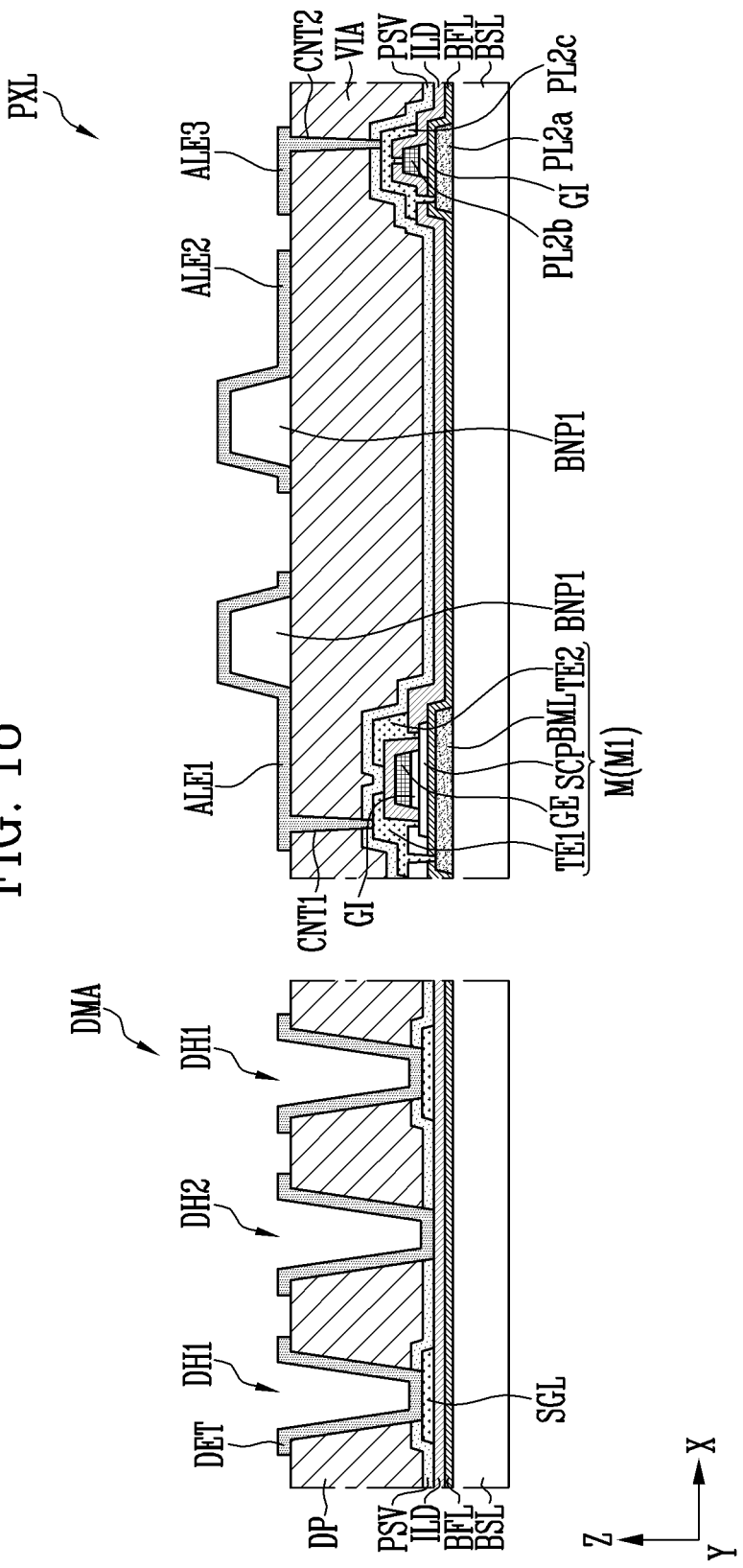

Referring to FIG. 18, the electrode layer ELL may be thereafter etched so that the dummy electrodes DET may be formed in the dummy area DAM and the electrodes ALE may be formed in the pixel PXL.

The dummy electrodes DET may be formed on the dummy pattern layers DP. The dummy electrodes DET may cover the dummy holes DH1 and DH2. For example, the dummy electrodes DET may be disposed on the signal lines SGL exposed through the first dummy hole DH1 and protect the signal lines SGL. Thus, the signal lines SGL may be protected from being damaged during a subsequent process. The dummy electrodes DET may contact the signal lines SGL through contact holes that pass through the first dummy hole DH1 of the dummy pattern layers DP and the passivation layer PSV, but embodiments are not limited thereto.

The first electrode ALE1 among the electrodes ALE may contact the first transistor electrode TE1 through the first contact hole CNT1 that passes through the via layer VIA. The third electrode ALE3 among the electrodes ALE may contact the third power conductive layer PL2c through the second contact hole CNT2 that passes through the via layer VIA. The dummy electrodes DET and the electrodes ALE may be simultaneously formed by the same process. As described above, since the dummy electrodes DET each having a shape substantially identical or similar to that of the electrodes ALE in the display area DA is formed in the dummy area DMA, the process deviation may be minimized. Therefore, the uniformity of the electrodes ALE formed in the display area DA may be improved.

Figure 19:
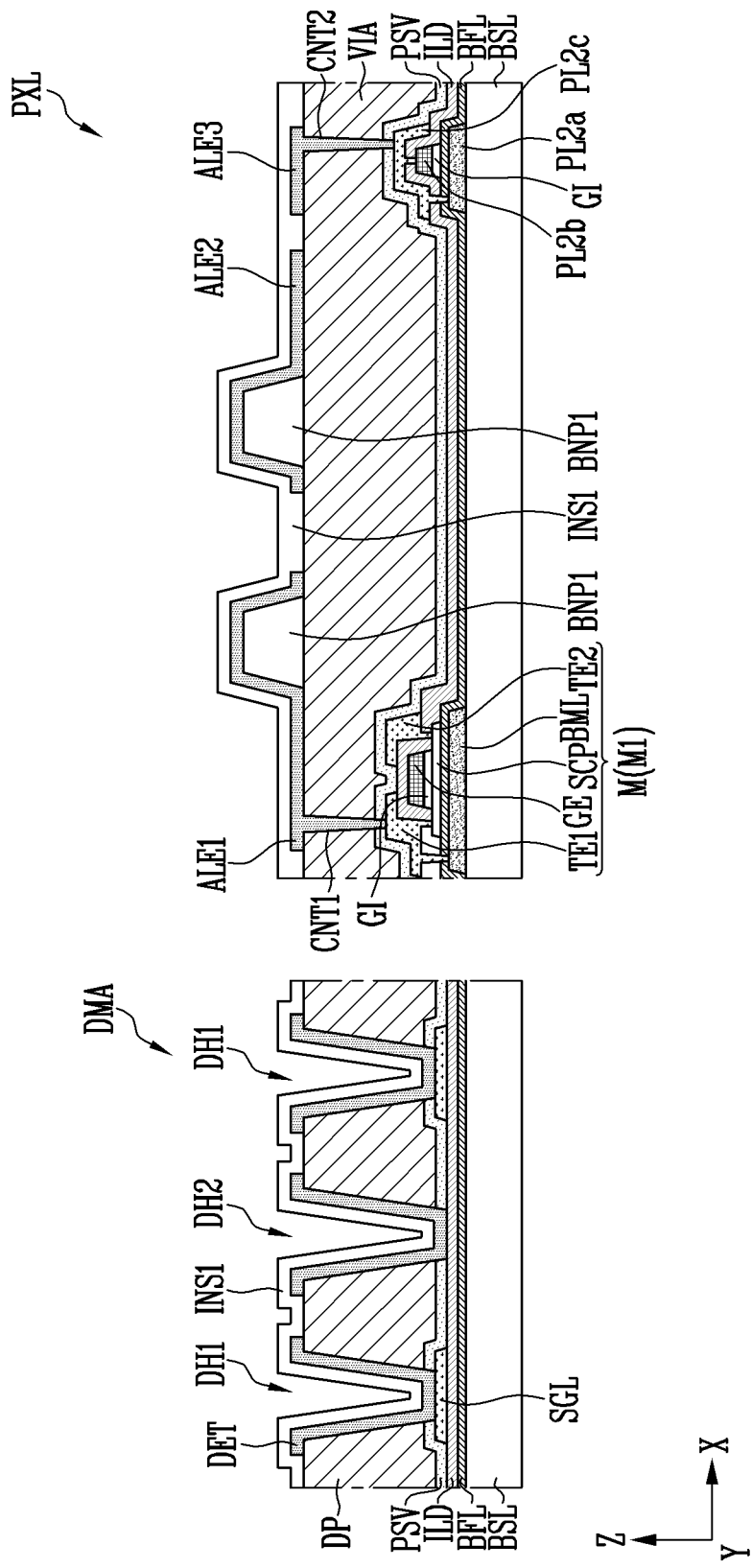

Referring to FIG. 19, the first insulating layer INS1 may be thereafter formed on the dummy electrodes DET and the electrodes ALE. The first insulating layer INS1 may be formed over the dummy area DMA and the pixel PXL.

Figure 20:
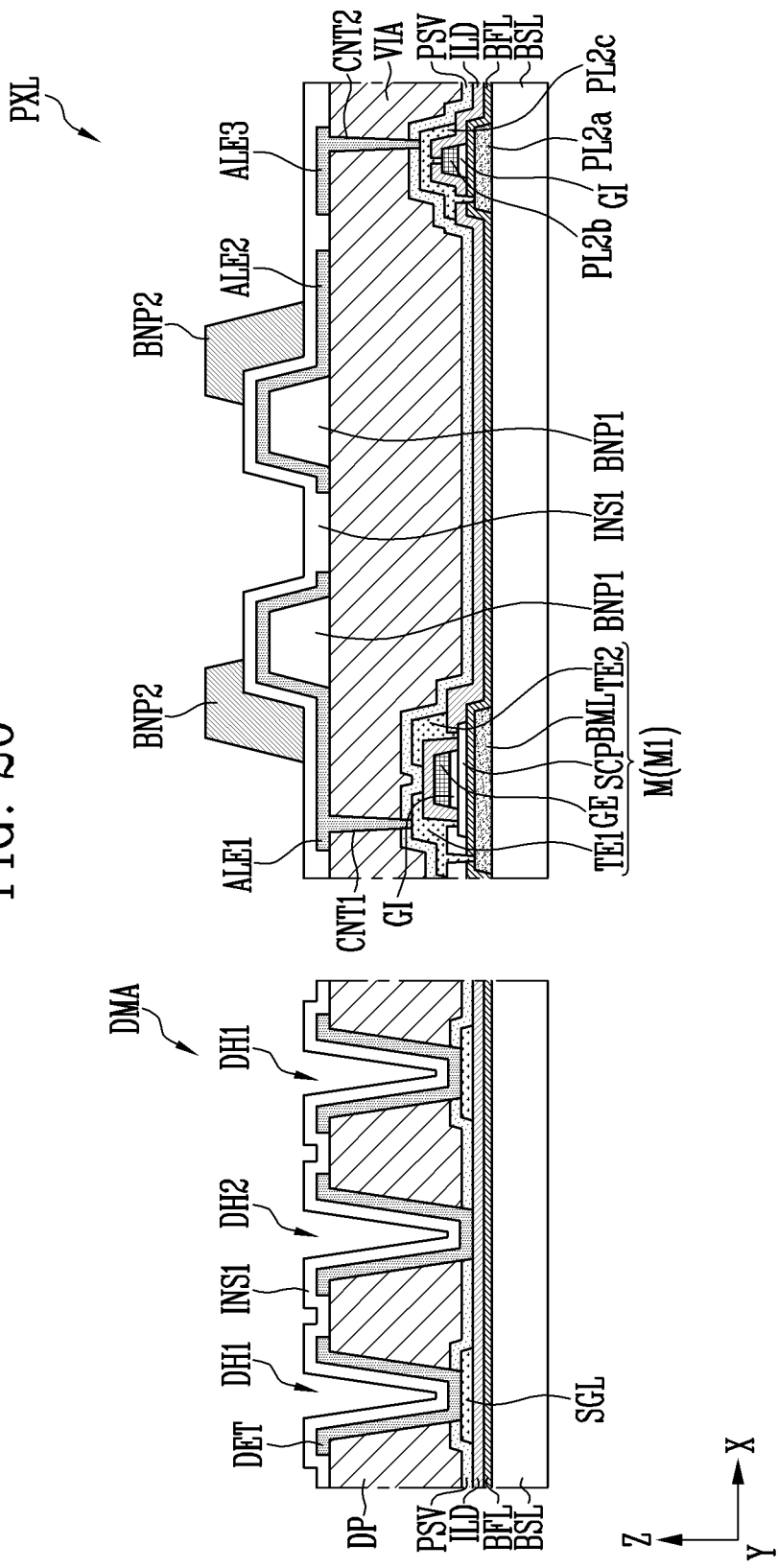

Referring to FIG. 20, the second bank pattern layers BNP2 may be thereafter formed on the first insulating layer INS1. The second bank pattern layers BNP2 may be formed in the pixel PXL, and form, at the step of supplying the light emitting elements LD to the pixel PXL, a dam structure for defining an emission area to which the light emitting elements LD are to be supplied. For example, a desired kind and/or amount of light emitting element ink may be supplied to the area defined by the second bank pattern layers BNP2.

Figure 21:
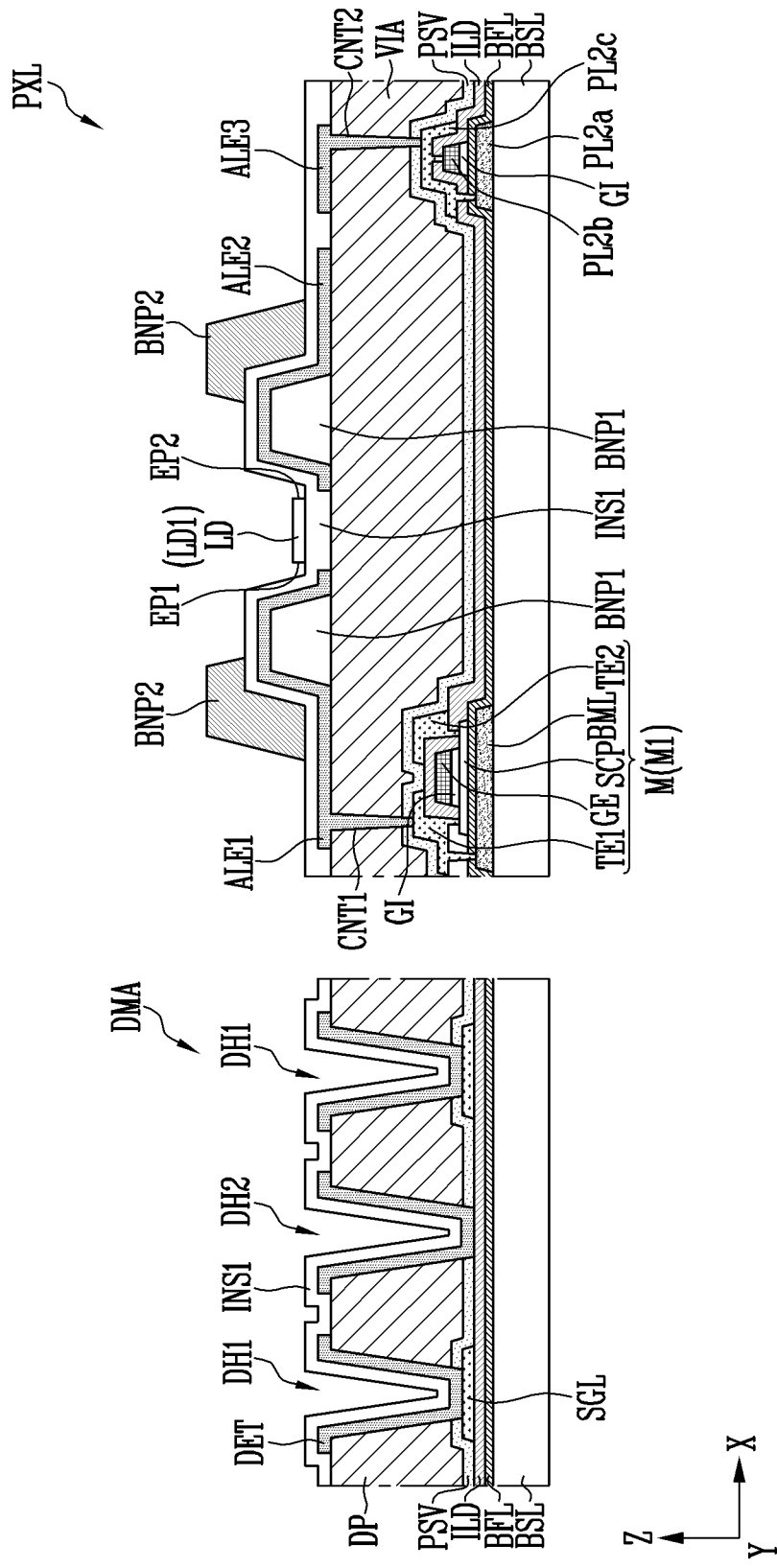

Referring to FIG. 21, the light emitting element LD may be thereafter disposed between the electrodes ALE. The light emitting element LD may be aligned on the first insulating layer INS1 between the electrodes ALE. The light emitting element LD may be prepared in a diffused form (or in a dispersed form) in the light emitting element ink, and supplied to each of the pixels PXL by an inkjet printing process or the like. For example, the light emitting element LD may be diffused in a volatile solvent and supplied to each of the pixels PXL. Thereafter, in cast that alignment signals are supplied to the electrodes ALE, an electric field may be formed between the electrodes ALE so that the light emitting element LD may be aligned between the electrodes ALE. After the light emitting element LD have been aligned, the solvent may be removed by a volatilization process or other processes. Thus, the light emitting element LD may be reliably arranged between the electrodes ALE.

Figure 22:
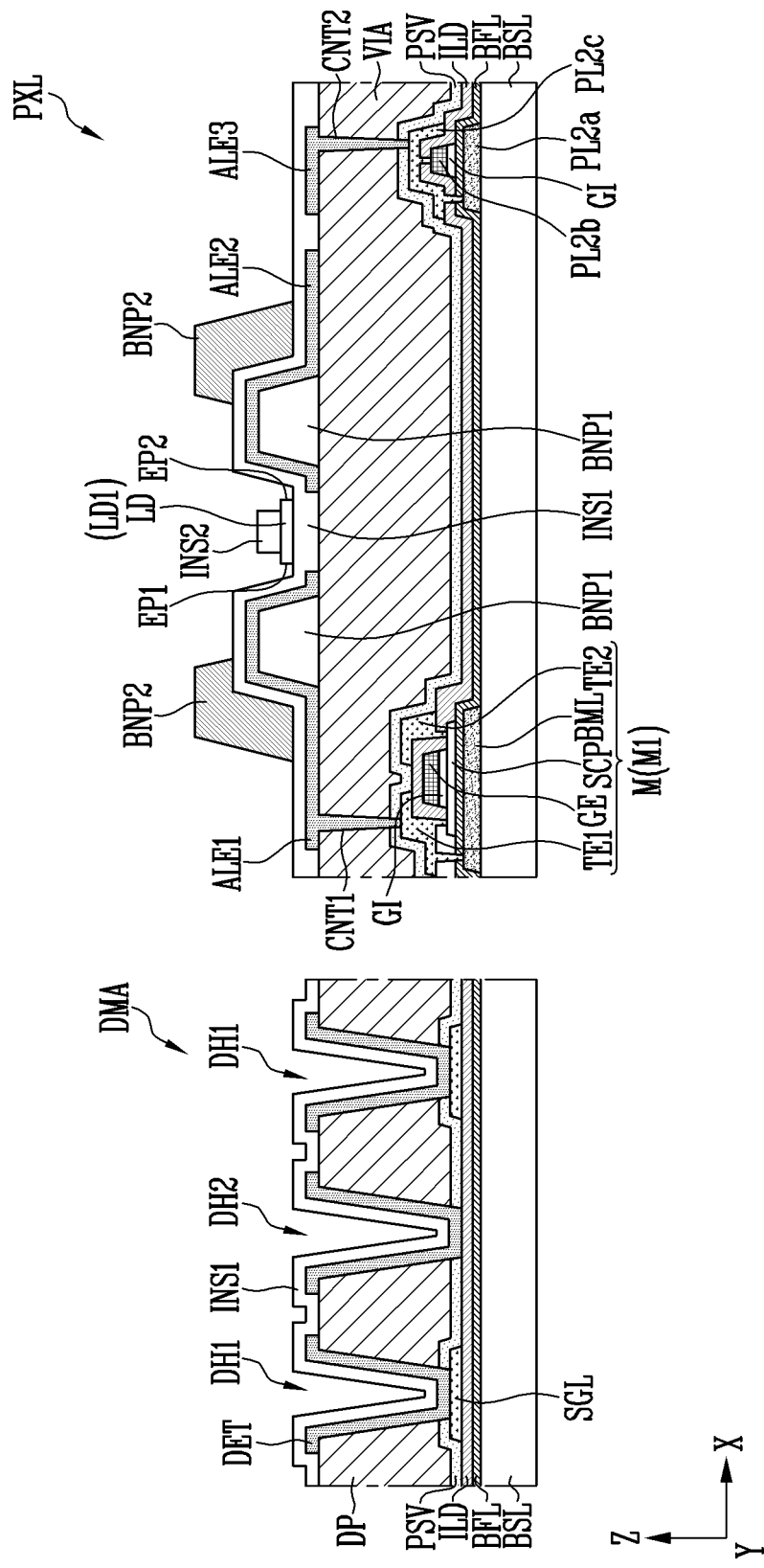

Referring to FIG. 22, the second insulating layer INS2 may be thereafter formed on the light emitting element LD. The second insulating layer INS2 may be formed (e.g., partially formed) on the light emitting element LD so that the first and second end portions EP1 and EP2 of the light emitting element LD may be exposed from the second insulating layer INS2. In case that the second insulating layer INS2 is formed on the light emitting elements LD after the alignment of the light emitting element LD has been completed, the light emitting element LD may be prevented from being removed (or misaligned) from the aligned position.

Figure 23:
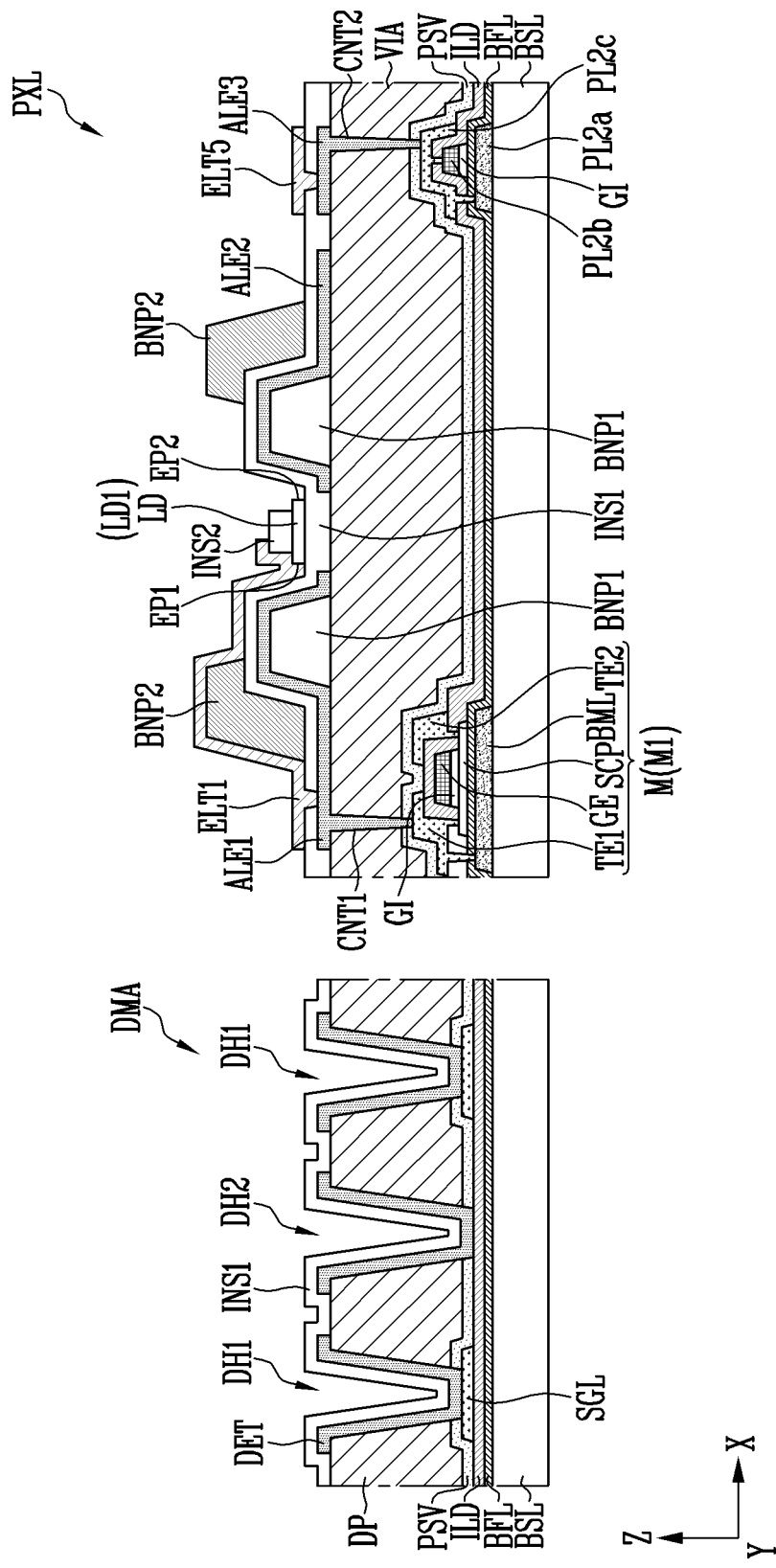

Referring to FIG. 23, the first connection electrode ELT1, the third connection electrode ELT3, and/or the fifth connection electrode ELT5 may be thereafter formed on an end of the light emitting element LD. The first connection electrode ELT1, the third connection electrode ELT3, and/or the fifth connection electrode ELT5 may contact the end of the light emitting element LD that is exposed from the second insulating layer INS2. The first connection electrode ELT1 may be electrically connected to the first electrode ALE1 through the corresponding contact hole passing through the first insulating layer INS1. The fifth connection electrode ELT5 may be electrically connected to the third electrode ALE3 through the corresponding contact hole passing through the first insulating layer INS1. Although the first connection electrode ELT1, the third connection electrode ELT3, and/or the fifth connection electrode ELT5 may be simultaneously formed by the same process, embodiments are not limited thereto.

Figure 24:
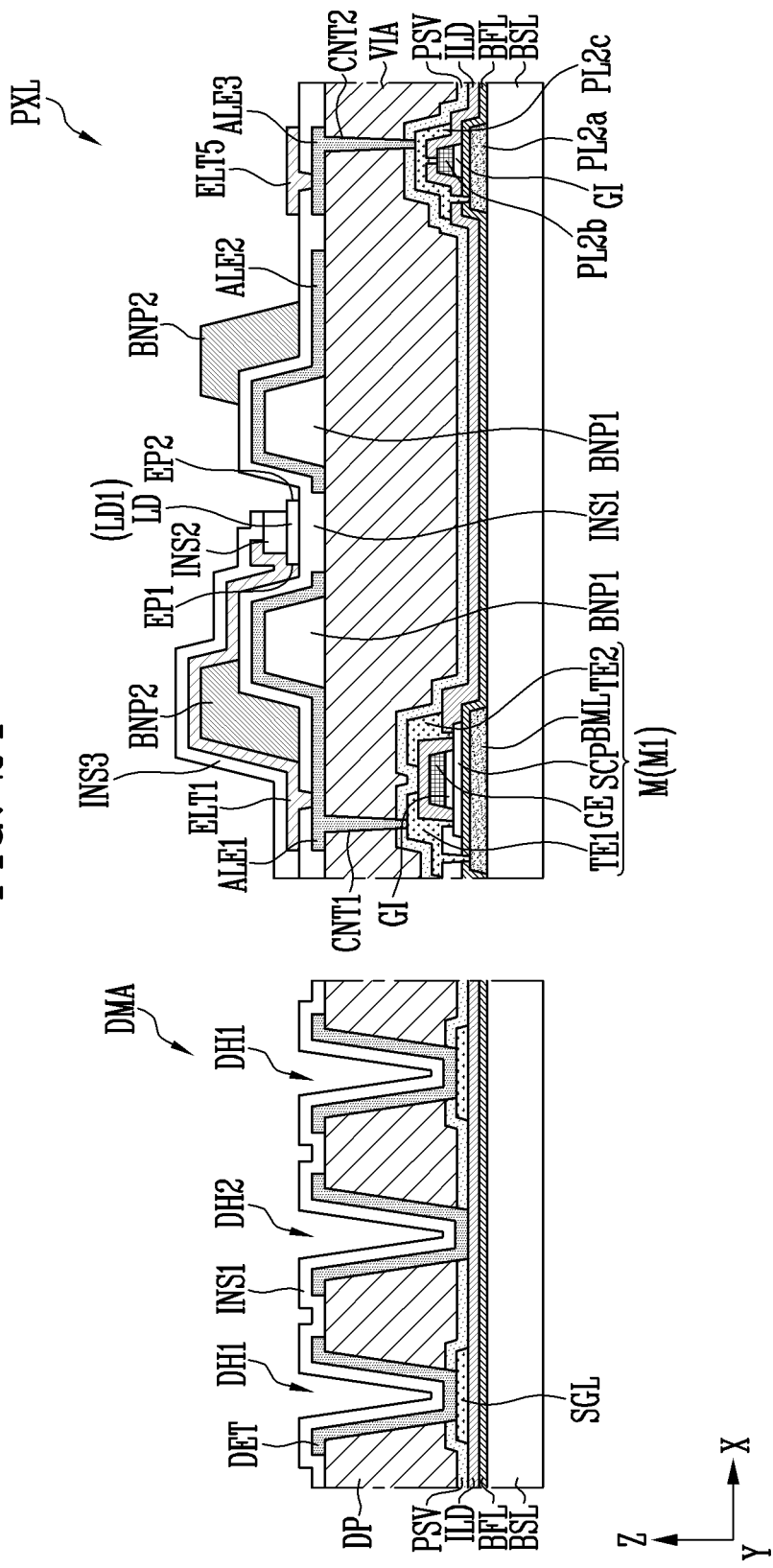

Referring to FIG. 24, the third insulating layer INS3 may be subsequently formed on the first connection electrode ELT1, the third connection electrode ELT3, and/or the fifth connection electrode ELT5. The third insulating layer INS3 may cover the first connection electrode ELT1, the third connection electrode ELT3, and/or the fifth connection electrode ELT5. For example, the third insulating layer INS3 may expose a remaining end of the light emitting element LD.

Thereafter, the second connection electrode ELT2 and/or the fourth connection electrode ELT4 may be formed on the remaining end of the light emitting element LD. Thus, the display device of FIGS. 6 and 9 may be implemented. The second connection electrode ELT2 and the fourth connection electrode ELT4 may be simultaneously formed by the same process, but embodiments are not limited thereto.

Hereinafter, another example will be described. In descriptions of the following embodiment, like reference numerals will be used to designate the above-described configurations and the same components, and redundant explanation thereof will be omitted or simplified for descriptive convenience.

FIGS. 25 to 28 are schematic cross-sectional views illustrating, by process steps, a method of fabricating the display device in accordance with an embodiment. FIGS. 25 to 28 are schematic cross-sectional views for describing the method of fabricating the display device based on FIGS. 6 to 12. Like references will be used to designate substantially the same components as those of the embodiment of FIGS. 6 to 12, and detailed explanation thereof will be omitted for descriptive convenience.

Figure 25:
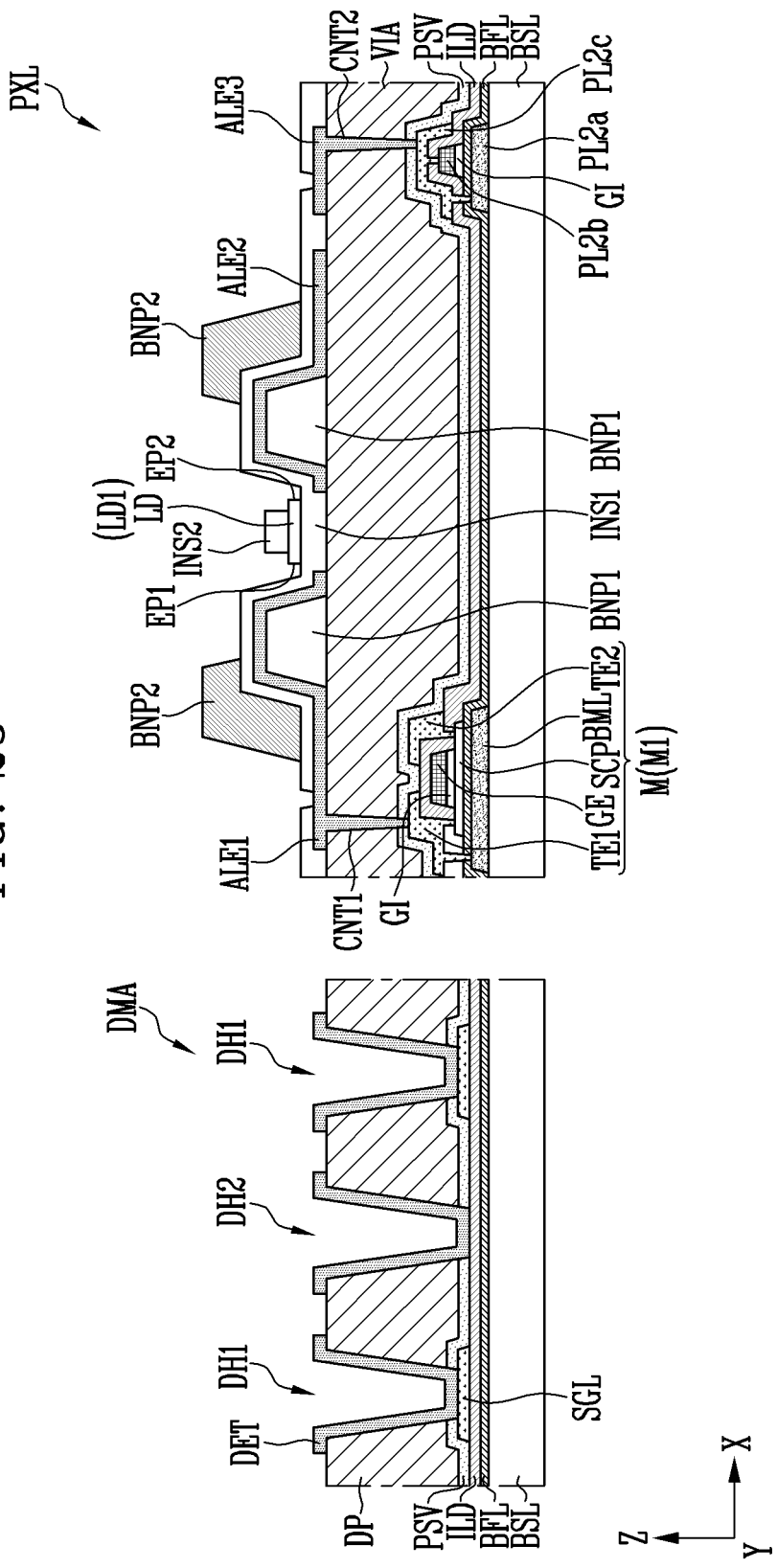
FIGS. 25 to 28 are schematic cross-sectional views illustrating, by process steps, a method of fabricating the display device in accordance with an embodiment.

Referring to FIG. 25, the method of fabricating the display device in accordance with the embodiment is different from the display device fabricating method of FIGS. 13 to 22 in that the first insulating layer INS1 is omitted from the dummy area DMA. For example, the first insulating layer INS1 may be disposed in the pixel PXL and removed from the dummy area DMA. Hence, the first insulating layer INS1 may expose the dummy electrodes DET of the dummy area DMA. The other parts of the process of fabricating the display device have been described in detail with reference to FIGS. 13 to 22, and redundant explanation thereof will be omitted for descriptive convenience.

Figure 26:
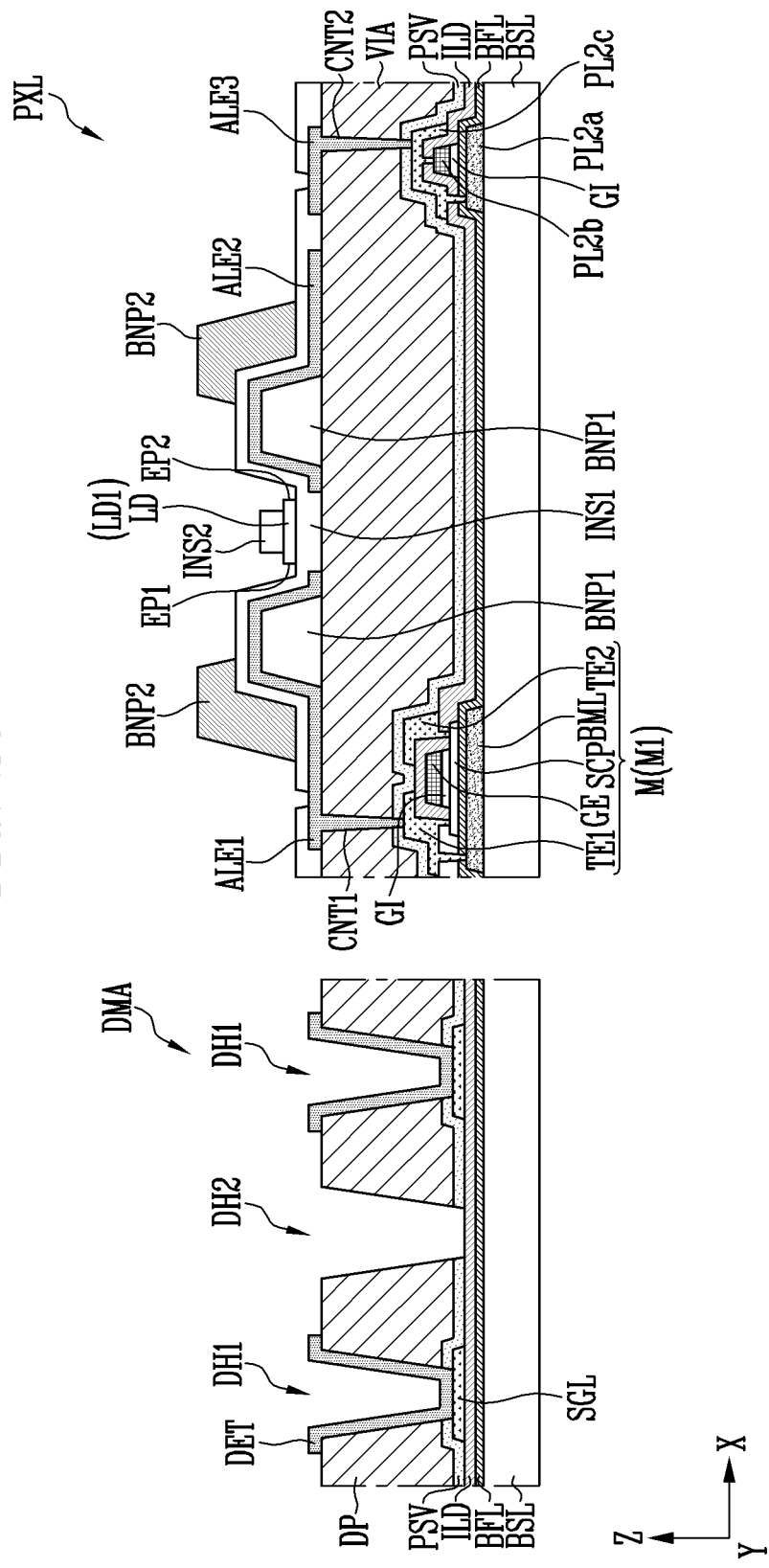

Referring to FIG. 26, the dummy electrodes DET may be removed from the second dummy holes DH2 of the dummy pattern layers DP. For example, the dummy electrodes DET may be formed (e.g., partially formed) on the first dummy holes DH1 of the dummy pattern layers DP. As described above, since the dummy electrodes DET are partially removed, the water permeation may be prevented.

Figure 27:
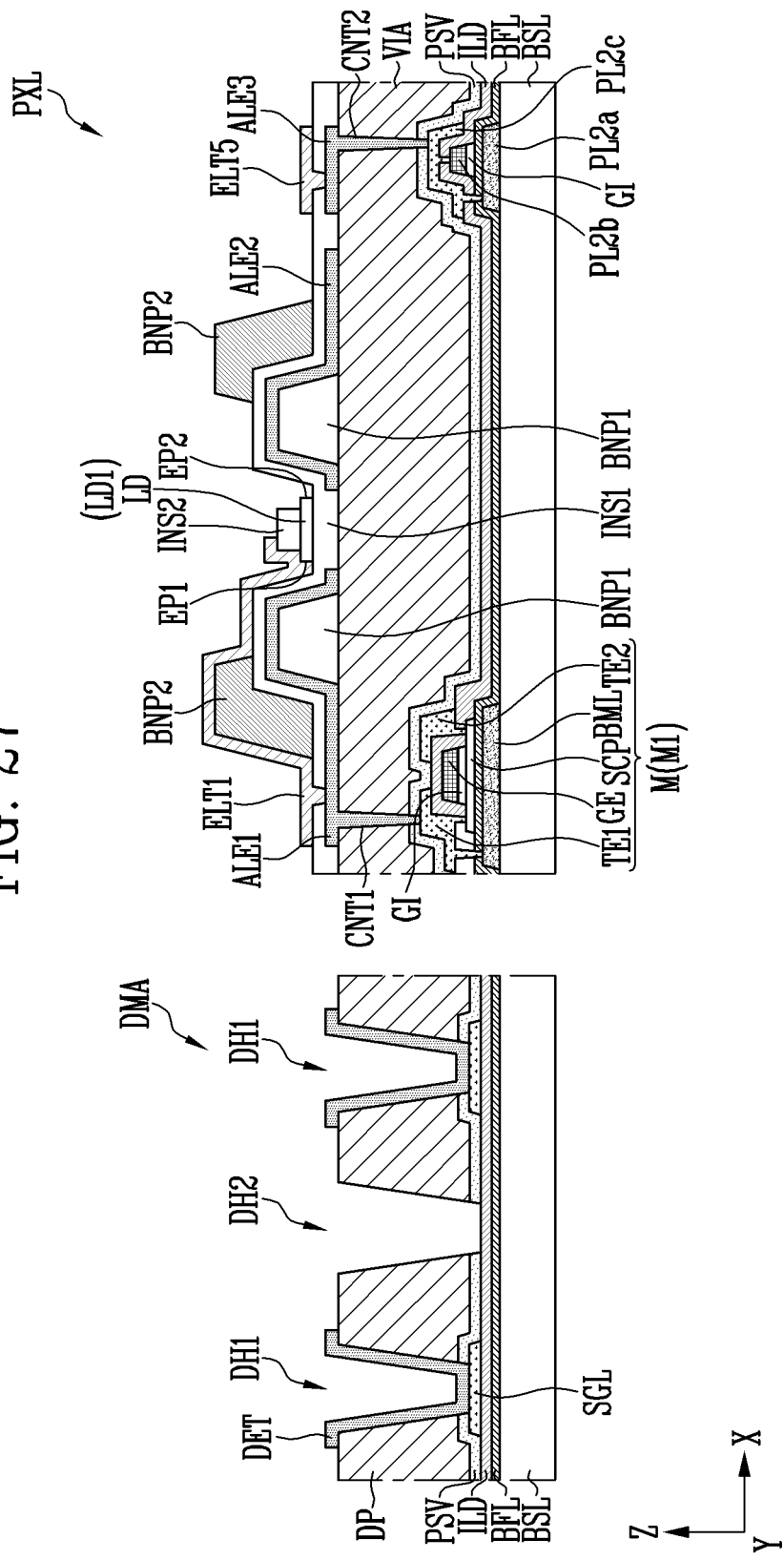

Referring to FIG. 27, the first connection electrode ELT1, the third connection electrode ELT3, and/or the fifth connection electrode ELT5 may be thereafter formed on an end of the light emitting element LD. The first connection electrode ELT1, the third connection electrode ELT3, and/or the fifth connection electrode ELT5 may contact the end of the light emitting element LD that is exposed from the second insulating layer INS2. The first connection electrode ELT1 may be electrically connected to the first electrode ALE1 through the corresponding contact hole passing through the first insulating layer INS1. The fifth connection electrode ELT5 may be electrically connected to the third electrode ALE3 through the corresponding contact hole passing through the first insulating layer INS1. Although the first connection electrode ELT1, the third connection electrode ELT3, and/or the fifth connection electrode ELT5 may be simultaneously formed by the same process, embodiments are not limited thereto.

Figure 28:
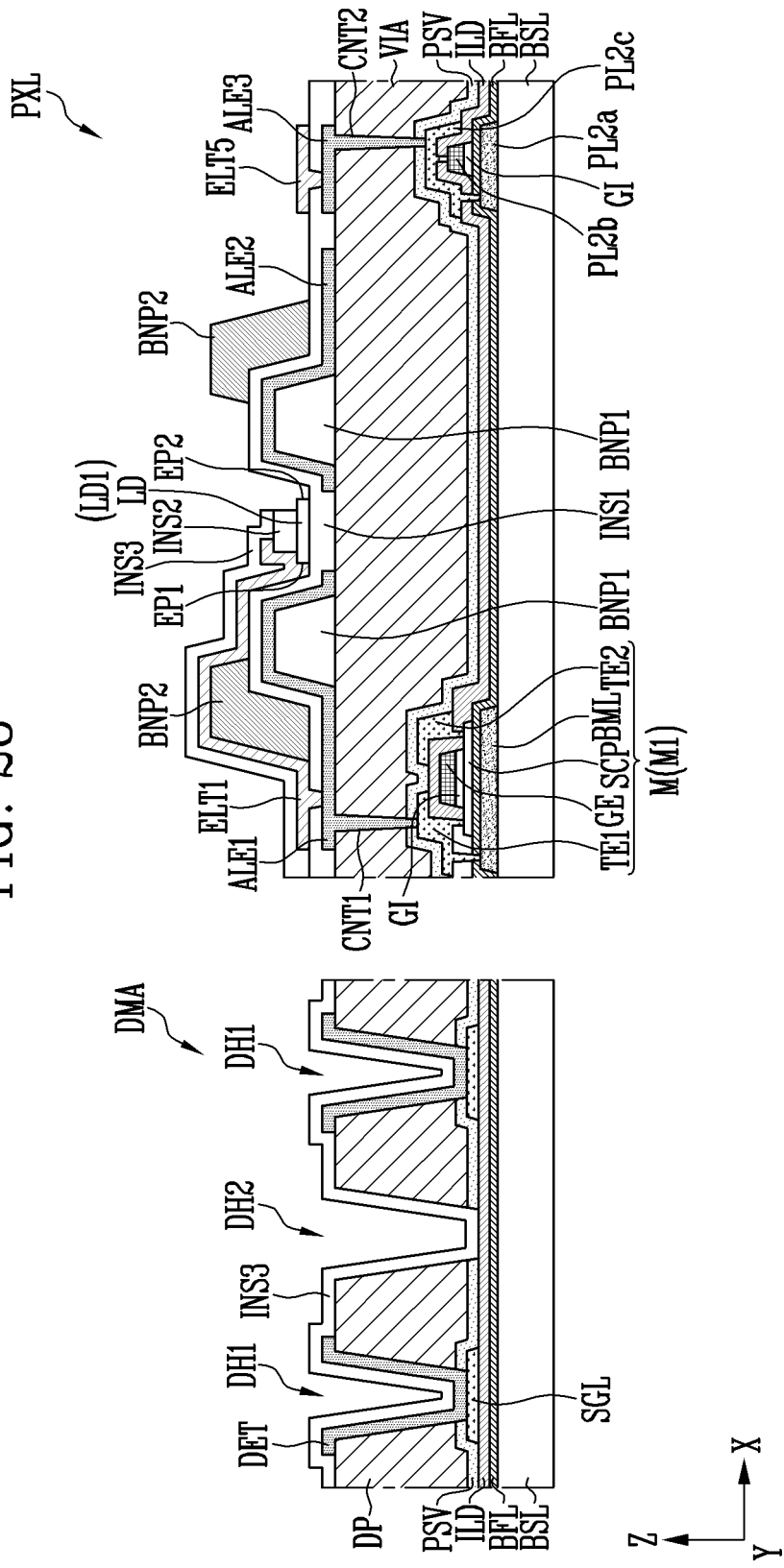

Referring to FIG. 28, the third insulating layer INS3 may be subsequently formed on the dummy electrodes DET, the first connection electrode ELT1, the third connection electrode ELT3, and/or the fifth connection electrode ELT5. The third insulating layer INS3 may be formed to cover the dummy area DMA and the pixel PXL. The third insulating layer INS3 may cover both the dummy electrodes DET that are disposed on the first dummy holes DH1. For example, the third insulating layer INS3 may cover the first dummy holes DH1 and the second dummy hole DH2. For example, the third insulating layer INS3 may cover the first connection electrode ELT1, the third connection electrode ELT3, and/or the fifth connection electrode ELT5. For example, the third insulating layer INS3 may expose a remaining end of the light emitting element LD.

Thereafter, the second connection electrode ELT2 and/or the fourth connection electrode ELT4 may be formed on the remaining end of the light emitting element LD. Thus, the display device of FIGS. 6 and 12 may be implemented. The second connection electrode ELT2 and the fourth connection electrode ELT4 may be simultaneously formed by the same process, but embodiments are not limited thereto.

The other parts of the method of fabricating the display device have been described in detail with reference to FIGS. 13 to 24, and redundant explanation thereof will be omitted for descriptive convenience.

In accordance with embodiments, dummy holes and/or dummy electrodes having shapes substantially identical or similar to that of contact holes and/or electrodes of a display area may be formed in a dummy area, so that a process deviation may be minimized. Therefore, uniformity of the contact holes and/or the electrodes formed in the display area may be improved.

The effects of the disclosure are not limited by the foregoing, and other various effects are anticipated herein.

It will be understood by those skilled in the art that various changes in form and details may be made therein without departing from the spirit and scope of the disclosure as defined by the appended claims. Therefore, the foregoing embodiments should be considered in descriptive sense only and not for purposes of limitation. The scope of embodiments is defined not by the detailed description of the disclosure but by the appended claims, and all differences within the scope will be construed as being included in the disclosure.

What is claimed is:

1. A display device comprising:
    a substrate comprising a display area comprising pixels, and a non-display area;
    a via layer in the display area;
    electrodes above the via layer and spaced apart from each other;
    light-emitting elements between the electrodes;
    dummy pattern layers in the non-display area;
    signal lines between the substrate and the dummy pattern layers, and configured to supply control signals or power to the pixels; and
    dummy electrodes above the dummy pattern layers,
    wherein the via layer and the dummy pattern layers are at a same layer, and
    wherein the electrodes and the dummy electrodes are at a same layer.

2. The display device according to claim 1, wherein the dummy pattern layers comprise dummy holes.

3. The display device according to claim 2, wherein the dummy holes comprise:
    a first dummy hole formed to expose the signal lines; and
    a second dummy hole adjacent to the first dummy hole.

4. The display device according to claim 3, wherein the dummy electrodes cover the signal lines exposed through the first dummy hole.

5. The display device according to claim 3, wherein the dummy electrodes do not overlap the second dummy hole.

6. The display device according to claim 1, further comprising an insulating layer above the light-emitting elements and the dummy electrodes.

7. The display device according to claim 1, further comprising a color conversion layer above the light-emitting elements.

8. The display device according to claim 7, wherein the color conversion layer overlaps the dummy pattern layers.

9. The display device according to claim 7, further comprising a color filter layer above the color conversion layer.

10. A display device comprising:
a substrate comprising a display area comprising pixels, and a non-display area;
a via layer in the display area;
electrodes above the via layer and spaced apart from each other;
light-emitting elements between the electrodes;
dummy pattern layers disposed in the non-display area;
signal lines between the substrate and the dummy pattern layers, and configured to supply control signals or power to the pixels; and
dummy electrodes above the dummy pattern layers,
wherein the via layer and the dummy pattern layers are formed of a first same material, and
wherein the electrodes and the dummy electrodes are formed of a second same material.

11. A method of fabricating a display device, the method comprising:
forming a coating layer above a substrate;
forming a via layer in a display area and dummy pattern layers in a non-display area by etching the coating layer;
forming an electrode layer above the via layer and the dummy pattern layers;
forming electrodes above the via layer, and dummy electrodes above the dummy pattern layers, by etching the electrode layer; and
forming signal lines configured to supply control signals or power to pixels above the substrate.

12. The method according to claim 11, further comprising forming a source electrode and/or a drain electrode above the substrate.

13. The method according to claim 12, wherein the source electrode, the drain electrode, and the signal lines are simultaneously formed.

14. The method according to claim 12, wherein, during the process of etching the coating layer, a contact hole that exposes the source electrode and/or the drain electrode is formed in the via layer.

15. The method according to claim 12, wherein, during the process of etching the coating layer, a first dummy hole exposing the signal lines and a second dummy hole adjacent to the first dummy hole are formed in the dummy pattern layers.

16. The method according to claim 15, wherein the dummy electrodes are formed in the first dummy hole and the second dummy hole.

17. The method according to claim 16, further comprising removing one of the dummy electrodes from the second dummy hole.

18. The method according to claim 11, further comprising disposing light-emitting elements between the electrodes.

19. The method according to claim 18, further comprising forming an insulating layer above the light-emitting elements and the dummy electrodes.

* * * * *